United States Patent
Otake

(10) Patent No.: US 10,418,895 B2
(45) Date of Patent: Sep. 17, 2019

(54) POWER MODULE AND POWER CIRCUIT

(71) Applicant: ROHM CO., LTD., Kyoto-shi, Kyoto (JP)

(72) Inventor: Hirotaka Otake, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 15/496,651

(22) Filed: Apr. 25, 2017

(65) Prior Publication Data
US 2017/0229953 A1   Aug. 10, 2017

Related U.S. Application Data

(63) Continuation of application No. PCT/JP2015/078160, filed on Oct. 5, 2015.

(30) Foreign Application Priority Data

Oct. 30, 2014 (JP) .................. 2014-221265

(51) Int. Cl.
*H02M 1/34* (2007.01)
*H01L 25/07* (2006.01)
(Continued)

(52) U.S. Cl.
CPC ............ *H02M 1/34* (2013.01); *H01L 23/293* (2013.01); *H01L 23/3114* (2013.01);
(Continued)

(58) Field of Classification Search
CPC .................. H02M 1/34; H02M 7/5387; H02M 2001/348; H01L 23/5386; H01L 29/7804;
(Continued)

(56) References Cited

U.S. PATENT DOCUMENTS 5,172,310 A * 12/1992 Deam ............... H01L 23/52
257/E23.141
5,623,399 A * 4/1997 Ishii .................. H02M 7/003
363/132
(Continued)

FOREIGN PATENT DOCUMENTS

JP   2009-71129 A    4/2009
JP   2012115128 A    6/2012
(Continued)

OTHER PUBLICATIONS

Received STIC search report for claim 2 from EIC 2800 searcher John DiGeronimo on Oct. 5, 2017.*
(Continued)

*Primary Examiner* — Nguyen Tran
*Assistant Examiner* — Htet Z Kyaw
(74) *Attorney, Agent, or Firm* — Hamre, Schumann, Mueller & Larson, P.C.

(57) ABSTRACT

A power module includes: a bridge unit including a bridge circuit composed including a plurality of SiC-MOSFETs Q1 and Q2 and an internal capacitor C1 connected so as to extend over between both ends of the bridge circuit; power terminals P and N of which one ends are respectively connected to both ends of the bridge unit and other ends are respectively exposed to the outside; and a snubber circuit (RB, CB) connected so as to extend over between an exposed side of the positive-side power terminal P and an exposed side of the negative-side power terminal N. A power circuit comprising the power module, and a smoothing capacitor C2 connected in parallel to the snubber circuit. There can be provided the power module and the power circuit which can simultaneously realize the low parasitic inductance and the low noise.

28 Claims, 15 Drawing Sheets

(51) Int. Cl.
*H01L 25/18* (2006.01)
*H01L 23/29* (2006.01)
*H01L 23/31* (2006.01)
*H01L 23/498* (2006.01)
*H01L 23/538* (2006.01)
*H01L 29/10* (2006.01)
*H01L 29/16* (2006.01)
*H01L 29/423* (2006.01)
*H01L 29/78* (2006.01)
*H02M 7/5387* (2007.01)
*H02M 3/158* (2006.01)
*H02M 7/00* (2006.01)

(52) U.S. Cl.
CPC .. *H01L 23/49822* (2013.01); *H01L 23/49894* (2013.01); *H01L 23/5386* (2013.01); *H01L 25/07* (2013.01); *H01L 25/072* (2013.01); *H01L 25/18* (2013.01); *H01L 29/1095* (2013.01); *H01L 29/1608* (2013.01); *H01L 29/4236* (2013.01); *H01L 29/7802* (2013.01); *H01L 29/7804* (2013.01); *H01L 29/7813* (2013.01); *H02M 3/158* (2013.01); *H02M 7/003* (2013.01); *H02M 7/5387* (2013.01); *H01L 23/3121* (2013.01); *H01L 2224/49113* (2013.01); *H01L 2224/49175* (2013.01); *H01L 2924/0002* (2013.01); *H02M 2001/348* (2013.01); *Y02B 70/1483* (2013.01)

(58) Field of Classification Search
CPC ............ H01L 29/1095; H01L 29/7813; H01L 23/3114; H01L 23/293; H01L 29/1608; H01L 23/49894; H01L 23/49822; H01L 25/18; H01L 25/072; H01L 29/4236
USPC .......................................................... 363/50
See application file for complete search history.

(56) References Cited

U.S. PATENT DOCUMENTS

| | | | | |
|---|---|---|---|---|
| 7,190,564 B2* | 3/2007 | Yunus | ...................... | H02M 1/34 361/91.7 |
| 7,525,781 B2* | 4/2009 | Yunus | ...................... | H02M 1/34 361/91.7 |
| 8,258,618 B2* | 9/2012 | Obiraki | ................. | H01L 23/142 257/150 |
| 8,508,258 B2* | 8/2013 | Ishikawa | ............. | H01L 27/0248 327/108 |
| 8,659,920 B2* | 2/2014 | Yamaguchi | ............. | H02M 1/34 363/56.02 |
| 8,705,257 B2* | 4/2014 | Yamaguchi | ............. | H05K 7/209 257/691 |
| 8,884,720 B2* | 11/2014 | Kanno | ................... | H01G 4/005 333/185 |
| 8,890,453 B2* | 11/2014 | Kure | ....................... | B60L 3/003 318/400.01 |
| 9,048,837 B2* | 6/2015 | Hirose | ................. | H03K 17/302 |
| 9,147,622 B2* | 9/2015 | Otake | ..................... | H01L 24/34 |
| 9,231,466 B2* | 1/2016 | Hayashiguchi | ........ | H02M 7/003 |
| 9,373,617 B2* | 6/2016 | Das | ...................... | H01L 27/0629 |
| 9,570,972 B2* | 2/2017 | Kanda | ..................... | H02M 1/34 |
| 9,691,673 B2* | 6/2017 | Otake | ..................... | H01L 23/48 |
| 9,768,678 B1* | 9/2017 | Stanley | ................... | H02M 1/34 |
| 9,819,338 B2* | 11/2017 | Otake | .................. | H03K 17/162 |
| 2006/0072259 A1* | 4/2006 | Yunus | ..................... | H02M 1/34 361/56 |
| 2010/0171473 A1* | 7/2010 | Kazama | .................. | H02M 1/34 323/271 |
| 2011/0037536 A1* | 2/2011 | Kanno | ................... | H01G 4/005 333/185 |
| 2012/0106220 A1* | 5/2012 | Yamaguchi | ............. | H05K 7/209 363/131 |
| 2012/0147641 A1* | 6/2012 | Yamaguchi | ............. | H02M 1/34 363/132 |
| 2012/0182769 A1* | 7/2012 | Yonezawa | ................ | H02M 1/34 363/21.12 |
| 2013/0049654 A1* | 2/2013 | Kure | ........................ | B60L 3/003 318/400.2 |
| 2013/0258736 A1* | 10/2013 | Higuchi | ................ | H01L 25/072 363/131 |
| 2014/0226376 A1* | 8/2014 | Hayashiguchi | ........ | H02M 7/003 363/56.12 |
| 2014/0246681 A1* | 9/2014 | Das | ...................... | H01L 27/0629 257/77 |
| 2014/0252494 A1* | 9/2014 | Lui | ...................... | H01L 27/0629 257/379 |
| 2014/0321171 A1* | 10/2014 | Fujita | ...................... | H02M 1/14 363/37 |
| 2015/0084685 A1* | 3/2015 | Hirose | ................. | H03K 17/302 327/382 |
| 2016/0344279 A1* | 11/2016 | Kanda | ..................... | H02M 1/34 |
| 2017/0162466 A1* | 6/2017 | Sawada | ................ | H01L 23/3675 |
| 2018/0006549 A1* | 1/2018 | Torii | ....................... | H02M 1/14 |
| 2018/0048306 A1* | 2/2018 | Otake | ............... | H01L 23/49548 |

FOREIGN PATENT DOCUMENTS

| | | | |
|---|---|---|---|
| JP | 2013-45882 A | | 3/2013 |
| JP | 2014-30286 A | | 2/2014 |
| JP | 2014053516 | * | 3/2014 |
| WO | H10-308510 | | 11/1998 |
| WO | 2012/073571 | | 6/2012 |
| WO | 2013/132528 A1 | | 9/2013 |

OTHER PUBLICATIONS

Received STIC search results for claims 1 and 13 from EIC 2800 searcher Samir Patel on Oct. 10, 2017.*
Translated version of foreign patent JP2014053516 A with Espacenet.*
Received STIC search report from EIC 2800 searcher John DiGeronimo on Jul. 12, 2018.*
International Search Report and Written Opinion, International Patent Application No. PCT/JP2015/078160, dated Dec. 28, 2015, with English translation of Search Report (8 pages).

* cited by examiner

POWER MODULE AND POWER CIRCUIT

CROSS REFERENCE TO RELATED APPLICATIONS

This is a continuation application (CA) of PCT Application No. PCT/JP2015/078160, filed on Oct. 5, 2015, which claims priority to Japan Patent Application No. P2014-221265 filed on Oct. 30, 2014 and is based upon and claims the benefit of priority from prior Japanese Patent Application No. P2014-221265 filed on Oct. 30, 2014 and PCT Application No. PCT/JP2015/078160, filed on Oct. 5, 2015, the entire contents of each of which are incorporated herein by reference.

FIELD

Embodiments described herein relate to a power module and a power circuit.

BACKGROUND

Many research institutions are currently conducting research to develop Silicon Carbide (SiC), the SiC has been already supplied as power device products all around the world from a plurality of companies. Advantages of power devices formed using SiC which is a wideband gap semiconductor include lower on-resistance, higher switching speed, higher temperature operation, etc., than conventional Si power devices.

However, when power modules for switching large currents at high frequencies by utilizing such high-speed switching characteristics are fabricated, it causes problems, e.g., an increase of switching power losses or avalanche breakdown of the power devices due to voltage surges, or malfunctions of main transistor due to gate voltage vibration resulting from current inflows to feedback capacitance if parasitic inductances of ringing loops which strongly affect an amount of surge voltages to be applied to the power devices to be built-in are not sufficiently decreased.

There is a method of using laminated wiring for wiring bus (BUS) in modules, as one of the methods for reducing parasitic inductances of power modules. However, when using transfer-mold type power modules, it is difficult to introduce the laminated wiring at a periphery of externally-exposed terminal units in particular due to a relationship of fixing objects to be molded by pressing down terminals with metallic molds etc., in a case of molding, and parasitic inductances of terminals become a stumbling block therefor also in a viewpoint of securing a creepage distance between terminals.

In order to solve such a problem, a circuit unit which can form a semiconductor element at an OFF state and a closed loop having low inductance is formed without including an externally-exposed terminal by disposing an internal capacitor nearer to a side of a bridge than a terminal connection unit, and, thereby the voltage surges can be reduced.

SUMMARY

However, when the inventor confirmed an effect of an internal capacitor during a simulation of an inductive load switching circuit, the inventor found a large current ringing vibration (current ringing oscillation) which can be a noise source with regard to a current conducted to a terminal unit, while a voltage/current surge applied to a power device itself is improved.

The embodiments provide a power module and a power circuit which can simultaneously realize a low parasitic inductance and a low noise.

According to one aspect of the embodiments, there is provided a power module comprising: a bridge unit comprising a bridge circuit composed including a plurality of transistor elements and an internal capacitor connected so as to extend over between both ends of the bridge circuit; a positive-side power terminal and a negative-side power terminal of which one ends are respectively connected to both ends of the bridge unit and other ends are respectively exposed to an outside from a sealing unit for sealing the bridge unit; and a snubber circuit connected so as to extend over between an exposed side of the positive-side power terminal and an exposed side of the negative-side power terminal.

According to another aspect of the embodiments, there is provided a power module comprising: a main substrate; a first electrode pattern disposed on the main substrate, the first electrode pattern connected to a positive-side power terminal; a second electrode pattern disposed on the main substrate, the second electrode pattern connected to a negative-side power terminal; a third electrode pattern disposed on the main substrate, the third electrode pattern connected to an output terminal; a first transistor element of which a first output is disposed on the first electrode pattern; a second transistor element of which a second output is disposed on the third electrode pattern; an internal capacitor disposed between the first electrode pattern and the second electrode pattern; and a snubber circuit connected so as to extend over between a side of the positive-side power terminal exposed from the sealing unit and a side of the negative-side power terminal exposed from the sealing unit, the sealing unit configured to seal the first transistor element and the second transistor element.

According to still another aspect of the embodiments, there is provided a power module comprising: a bridge unit comprising a bridge circuit composed including a plurality of transistor elements and an internal capacitor connected so as to extend over between both ends of the bridge circuit; a positive-side power terminal and a negative-side power terminal of which one ends are respectively connected to both ends of the bridge unit and other ends are respectively exposed to an outside from a sealing unit for sealing the bridge unit; and a current-noise reduction circuit connected so as to extend over between an exposed side of the positive-side power terminal and an exposed side of the negative-side power terminal, the current-noise reduction circuit configured to reduce a current noise of the positive-side power terminal and the negative-side power terminal.

According to yet another aspect of the embodiments, there is provided a power circuit comprising: the above-mentioned power module; and a smoothing capacitor connected in parallel to the snubber circuit.

According to the embodiments, there can be provided the power module and the power circuit which can simultaneously realize the low parasitic inductance and the low noise.

DESCRIPTION OF EMBODIMENTS

Figure 1:
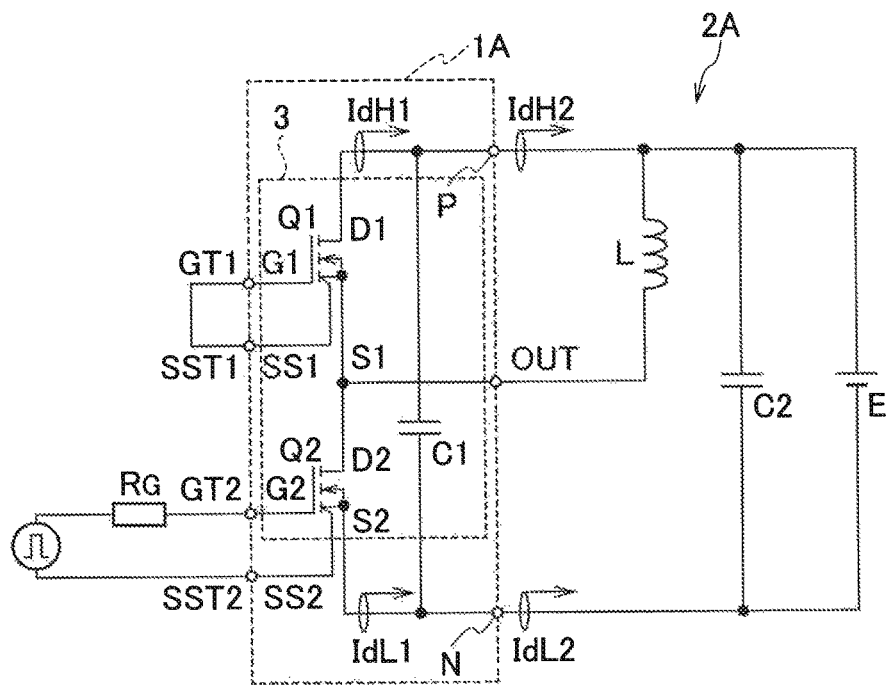
FIG. 1 is a schematic circuit configuration diagram of a half bridge circuit, which is a power circuit including a power module according to a basic technology.

Next, the embodiments will be described with reference to drawings. In the description of the following drawings, the identical or similar reference numeral is attached to the identical or similar part. However, it should be noted that the drawings are schematic and the relation between thickness and the plane size and the ratio of the thickness thereof differs from an actual thing. Therefore, detailed thickness and size should be determined in consideration of the following explanation. Of course, the part from which the relation and ratio of a mutual size differ also in mutually drawings is included.

Moreover, the embodiments described hereinafter merely exemplify the device and method for materializing the technical idea; and the embodiments do not specify the material, shape, structure, placement, etc. of each component part as the following. The embodiments may be changed without departing from the spirit or scope of claims.

[Basic Technology]

FIG. 1 shows a schematic circuit configuration of a half bridge circuit, which is a power circuit 2A including a power module 1A according to a basic technology.

As shown in FIG. 1, the power circuit 2A including the power module 1A according to the basic technology, the power circuit 2A including: a bridge unit 3 including a bridge circuit composed including a plurality of SiC-Metal-Oxide-Semiconductor Field Effect Transistors (SiC-MOSFET) Q1 and Q2, and an internal capacitor C1 connected so as to extend over between both ends of the bridge circuit; power terminals P and N of which one ends are respectively connected to both ends of the bridge unit 3 and other ends are respectively exposed to the outside; and a smoothing capacitor C2 connected in parallel so as to extend over between the respective exposed sides of the power terminals P and N.

As shown in FIG. 1, in the power circuit 2A including the power module 1A according to the basic technology, a source S1 of the SiC-MOSFET Q1 and a drain D2 of the SiC-MOSFET Q2 are electrically connected to each other, and thereby a half bridge circuit is composed. Gates G1 and G2 and source senses SS1 and SS2 of the SiC-MOSFETs Q1 and Q2 are respectively connected to gate terminals GT1 and GT2 and source sense terminals SST1 and SST2 for external extraction. A drain D1 of the SiC-MOSFET Q1 is connected to the power terminal P, and a source S2 of the SiC-MOSFET Q2 is connected to the power terminal N. Moreover, the source S1 of the SiC-MOSFET Q1 and the drain D2 of the SiC-MOSFET Q2 are connected to the output terminal OUT. Moreover, an internal capacitor C1 is connected between the drain D1 of the SiC-MOSFET Q1 and the source S2 of the SiC-MOSFET Q2; a load reactor L is externally connected between the output terminal OUT and the power terminal P; and a power source E is externally connected between the power terminals P and N.

Figure 2:
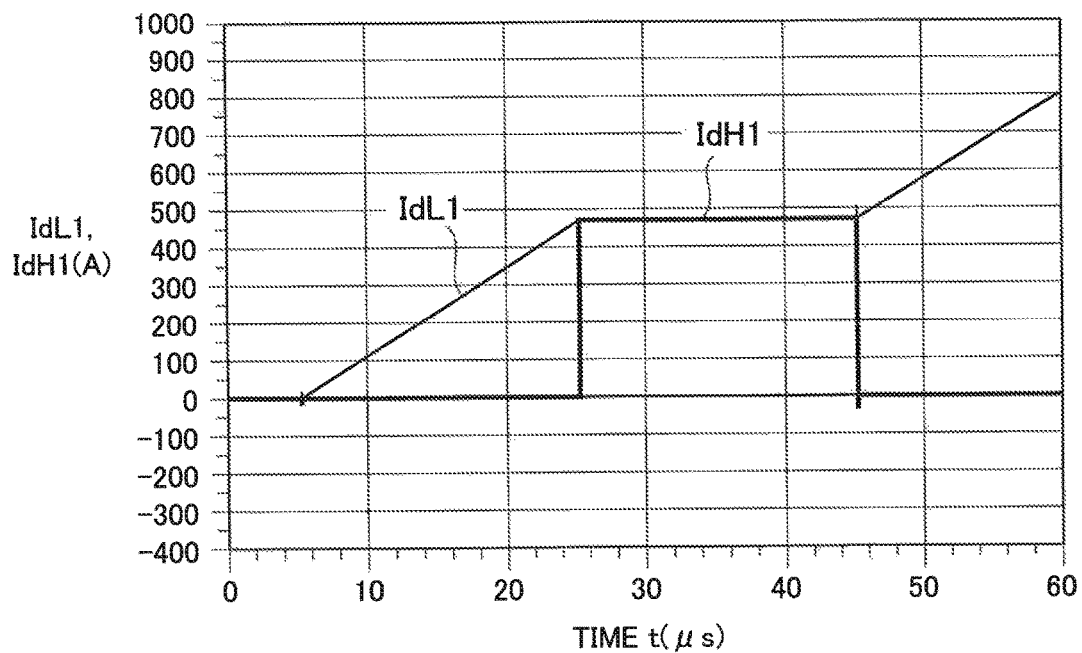
FIG. 2 shows an example of an operating waveform of currents IdH1 and IdL1 conducted to a device unit, in the power circuit including the power module according to the basic technology.
Figure 3:
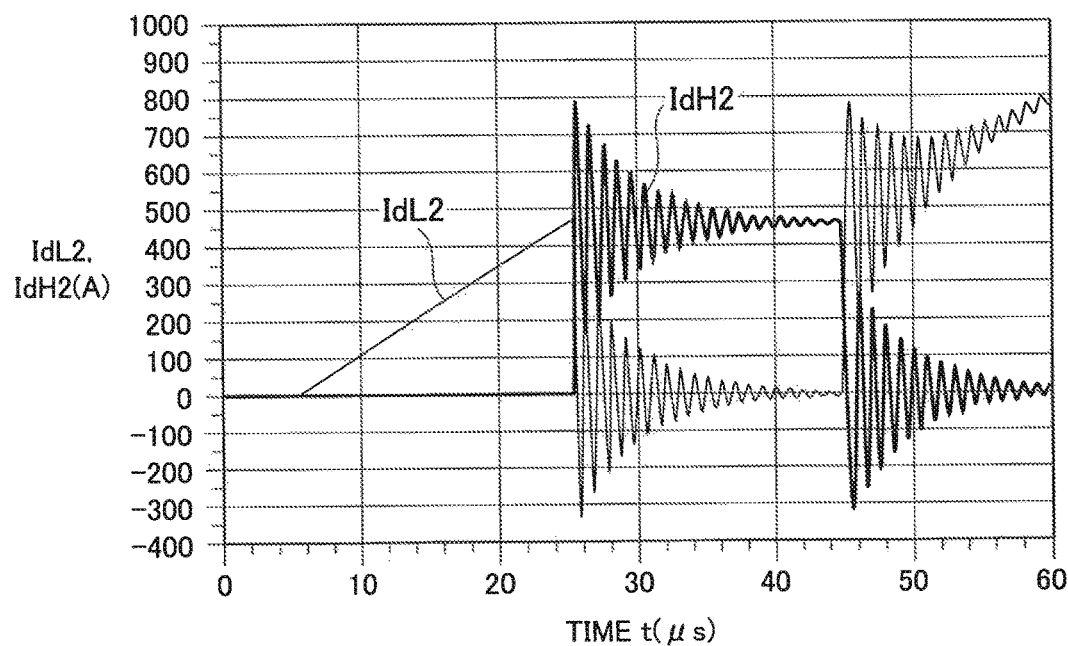
FIG. 3 shows an example of an operating waveform of currents IdL2 and IdH2 conducted to power terminals P and N, in the power circuit including the power module according to the basic technology.

FIGS. 2 and 3 show simulation results of the lower-arm-side SiC-MOSFET Q2 being operated by applying 400V to the power source E, and thereby turning off/turning on the lower-arm-side SiC-MOSFET Q2 with a load current of 470 A, in FIG. 1. More specifically, FIG. 2 shows a simulation result of an operating waveform of currents IdL1 and IdH1 conducted to a device unit, and FIG. 3 shows a simulation result of an operating waveform of the currents IdH2 and IdL2 conducted to the power terminals P and N, in a case where the gate terminal GT1 and the source sense terminal SST1 of the higher-arm-side first SiC-MOSFET Q1 is short-circuited to each other, and a pulse voltage is applied between the gate terminal GT2 and the source sense terminal SST2 of the lower-arm-side second SiC-MOSFET Q2 via a gate resistance $R_G$.

In the switching simulation of the load reactor L shown in FIG. 1, when an effect of the internal capacitor C1 is confirmed, it is confirmed that a voltage/current surge applied to the SiC-MOSFETs Q1 and Q2 themselves is largely improved.

On the other hand, as shown in FIG. 3, there is found a phenomenon in which the currents (IdH2, IdL2) which flows into the power terminals P and N or flows out thereto are largely vibrated at a moment of a switching operation of the lower-arm-side SiC-MOSFET Q2. This current ringing vibration is confirmed also in an actual measurement. Such an oscillatory phenomenon is a phenomenon not observed in the device unit of the power circuit 2A, but is a phenomenon observed in the power terminals P and N thereof.

Figure 4:
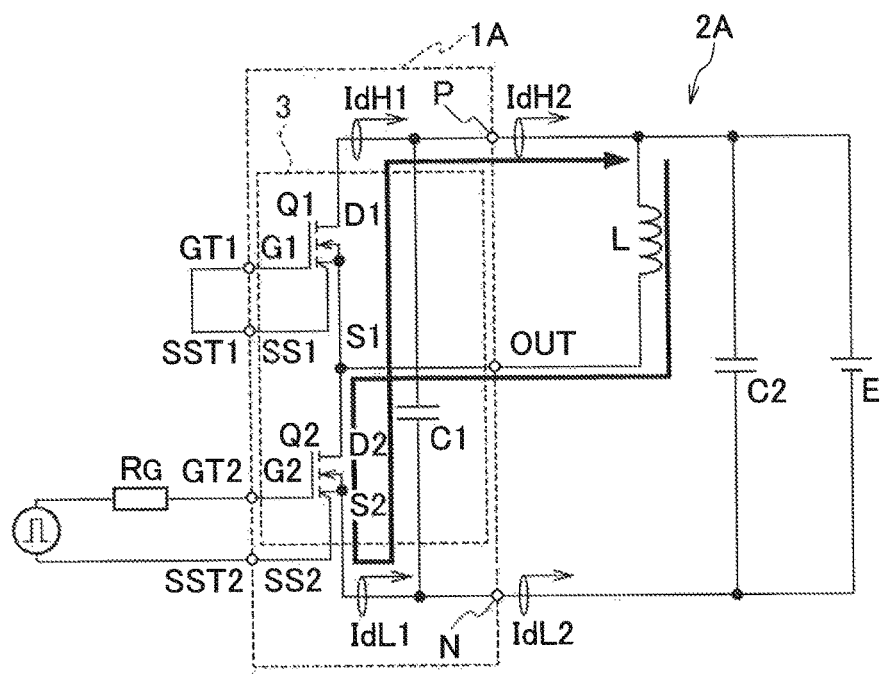
FIG. 4 is an explanatory diagram of a switching operation when turning on a lower-arm-side SiC-MOSFET Q2, in the power circuit including the power module according to the basic technology.
Figure 5:
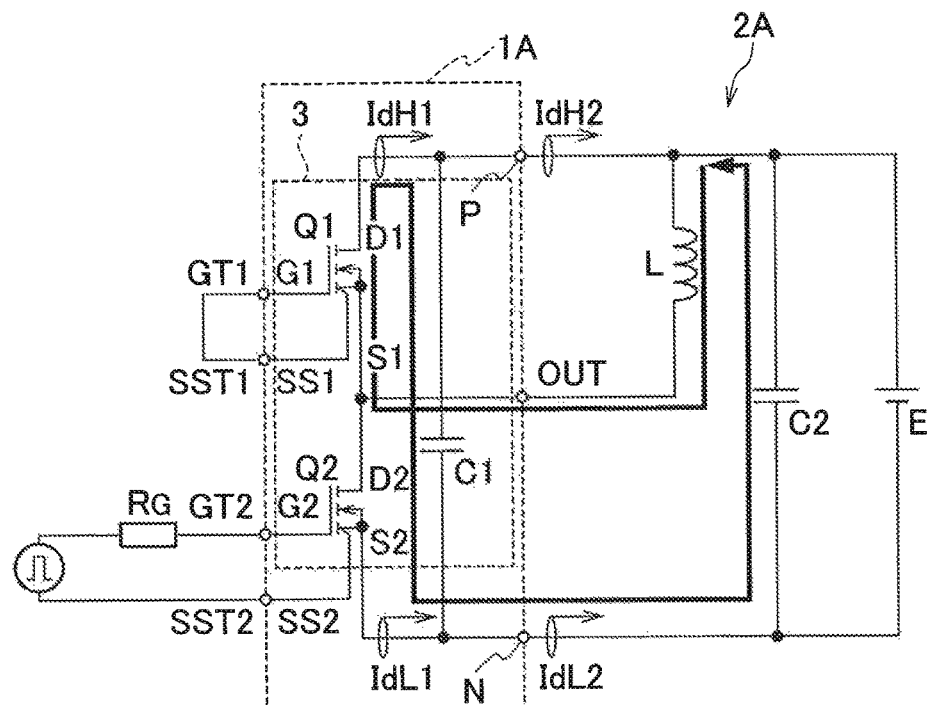
FIG. 5 is an explanatory diagram of a switching operation when turning off the lower-arm-side SiC-MOSFET Q2, in the power circuit including the power module according to the basic technology.

In the power circuit 2A including the power module 1A according to the basic technology, FIG. 4 shows an explanatory diagram of a switching operation when turning on the lower-arm-side SiC-MOSFET Q2, and FIG. 5 shows explanation of a switching operation when turning off the lower-arm-side SiC-MOSFET Q2.

As shown in FIG. 4, the oscillatory phenomenon immediately after turning-on of the lower-arm-side SiC-MOSFET Q2 is due to the following reason: the internal capacitor C1 discharges an electric charge as a supplier for supplying a load current, and then when an amount of the electric charge from which the voltage is dropped is filled up from an external circuit, ringing occurs between the internal capacitor C1 and the external circuit.

On the other hand, as shown in FIG. 5, the oscillatory phenomenon immediately after turning-off of the lower-arm-side SiC-MOSFET Q2 is due to the following reason: a load current which flows into the higher-arm-side SiC-MOSFET Q1 flows to a path through the internal capacitor C1 and the external circuit, and thereby an excessive charge is accumulated in the internal capacitor C1, and then ringing occur between the internal capacitor C1 and the external circuit during a process of discharging the excessive charge.

Such oscillatory phenomena do not appear in voltage/current waveforms in the device unit of the SiC-MOSFETs Q1 and Q2, and therefore switching power losses, avalanche breakdowns, malfunctions of main transistor due to gate voltage vibration resulting from a current inflow to a feedback capacitance between gate and drain can be reduced. On the other hand, a large current/voltage vibration which occurs at a periphery of the power terminals P and N causes a malfunction of a control circuit, as a noise. Moreover, there is a risk of switching relatively large voltages which are not expected if switching in a state of not being stabilizing of the voltage of the smoothing capacitor C2, and therefore it also becomes an stumbling block for high-frequency operations since switching power losses are increased. In particular the latter becomes a factor which inhibits reduction of physical size and weight and cost of the whole system by miniaturizing a passive element due to a high-frequency operation. Such a problem becomes more serious in power circuits using small-sized SiC based semiconductor elements which can realize high speed switching, high frequency, and large-current operations. Accordingly, it is not sufficient to only mount the internal capacitor C1 in the bridge unit 3.

[Embodiment]

Figure 6:
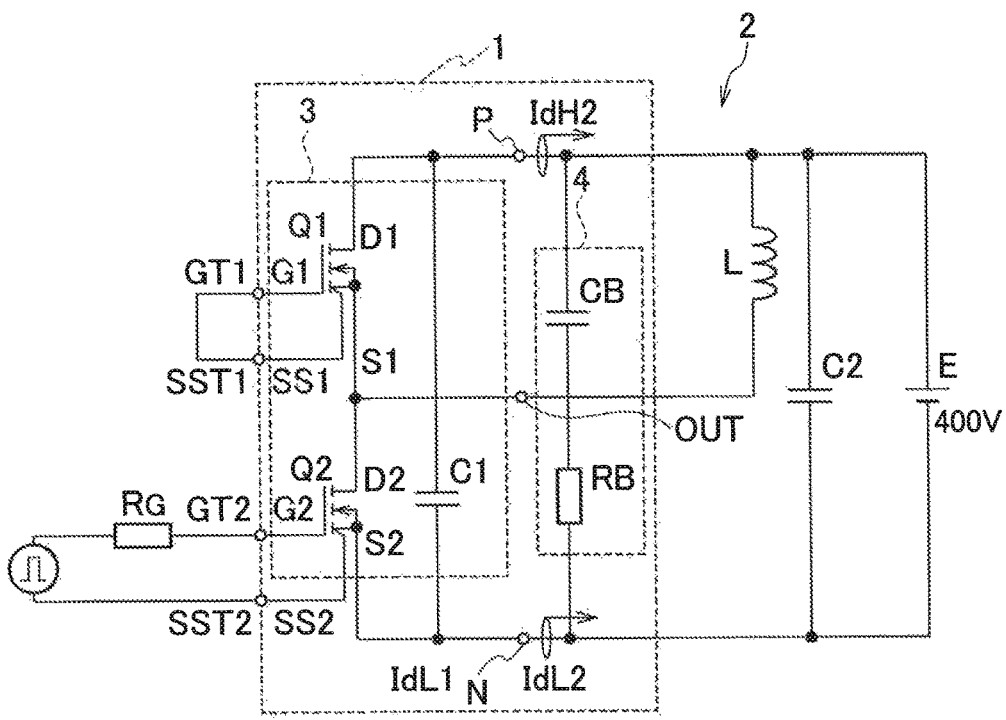
FIG. 6 is a schematic circuit configuration diagram of a half bridge circuit, which is a power circuit including a power module according to an embodiment.

FIG. 6 shows a schematic circuit configuration of a half bridge circuit, which is a power circuit 2 including a power module 1 according to an embodiment. In addition, the power circuit 2 including the power module 1 according to the embodiment is not limited to such a half bridge circuit, but can be applied also in full bridge circuits or three-phase bridge circuits.

As shown in FIG. 6, the power circuit 2 including the power module 1 according to the embodiment includes: a bridge unit 3 including a bridge circuit composed including a plurality of SiC-MOSFETs Q1 and Q2 and an internal capacitor C1 connected so as to extend over between both ends of the bridge circuit; power terminals P and N of which one ends are respectively connected to both ends of the bridge unit 3 and other ends are respectively exposed to the outside; and a snubber circuit 4 connected in series so as to extend over between the respective exposed sides of the power terminals P and N.

Moreover, as shown in FIG. 6, the power circuit 2 according to the embodiment may include a smoothing capacitor C2 connected in parallel to the snubber circuit 4.

Moreover, the snubber circuit 4 may include a snubber capacitor CB and a snubber resistor RB connected in series to each other.

Moreover, the bridge unit 3 may include any one of a half bridge circuit, a full bridge circuit, or a three-phase bridge circuit, and the internal capacitor C1 may connect a different capacitor for a plurality of respective bridges.

In the power circuit 2 including the power module 1 according to the embodiment, the internal capacitor C1 in which excess and deficiency of charges occur mainly due to discharging of stored charges for load currents or inflowing of the load current causes resonance with the smoothing capacitor C2 etc. Furthermore, resonance occurs in a closed loop formed including the snubber circuit 4 connected between the both ends of the bridge unit 3, energy is consumed by the snubber resistor RB in the snubber circuit 4, and thereby the vibration is converged. Generally, the RC snubber circuit is used in a form of being connected in parallel to one switch element. However, in the power circuit 2 according to the embodiment, the snubber circuit 4 is inserted in parallel to the bridge unit 3, and thereby the current ringing vibration which occurs between the both ends of the bridge unit 3 can be rapidly reduced.

Accordingly, the ringing can be quickly converged without increasing internal impedances of the power source E for supplying the power supply voltage, and the smoothing capacitor C2 for supplying the large current, and thereby the noise can be reduced. Moreover, since the voltage of the both ends of the smoothing capacitor C2 is rapidly stabilized, high-frequency operations can be realized in the power circuit 2 according to the embodiment.

In the power circuit 2 including the power module 1 according to the embodiment, as shown in FIG. 6, a source S1 of the SiC-MOSFET Q1 and a drain D2 of the SiC-MOSFET Q2 are electrically connected to each other, and thereby a half bridge circuit is composed. Gates G1 and G2 and source senses SS1 and SS2 of the SiC-MOSFETs Q1 and Q2 are respectively connected to gate terminals GT1 and GT2 and source sense terminals SST1 and SST2 for external extraction. A drain D1 of the SiC-MOSFET Q1 is connected to the power terminal P, and a source S2 of the SiC-MOSFET Q2 is connected to the power terminal N. Moreover, the source S1 of the SiC-MOSFET Q1 and the drain D2 of the SiC-MOSFET Q2 are connected to the output terminal OUT. Moreover, an internal capacitor C1 is connected between the drain D1 of the SiC-MOSFET Q1 and the source S2 of the SiC-MOSFET Q2; and the snubber circuit 4, composed including a series circuit of the snubber capacitor CB and the snubber resistor RB, and the smoothing capacitor C2 are externally connected between the power terminals P and N. Moreover, a load reactor L is connected between the output terminal OUT and the power terminal P, and the power source E is connected between the power terminals P and N.

In the embodiment, as numerical examples, a value of the internal capacitor C1 is approximately 1 μF, for example, a value of the smoothing capacitor C2 is approximately 125 μF, for example, and a value of the power source E is approximately 400V, for example. Moreover, a value of the snubber capacitor CB is preferable to be more than 10 times that of the internal capacitor C1, and is 10 μF, for example. Moreover, a resistance value by which the peak values IdH2P and IdL2P of the currents IdH2 and IdL2 conducted to the power terminals P and N can be substantially minimized is exist in the values of the snubber resistor RB, for example, and is approximately 40 mΩ on the above-mentioned conditions.

Figure 7:
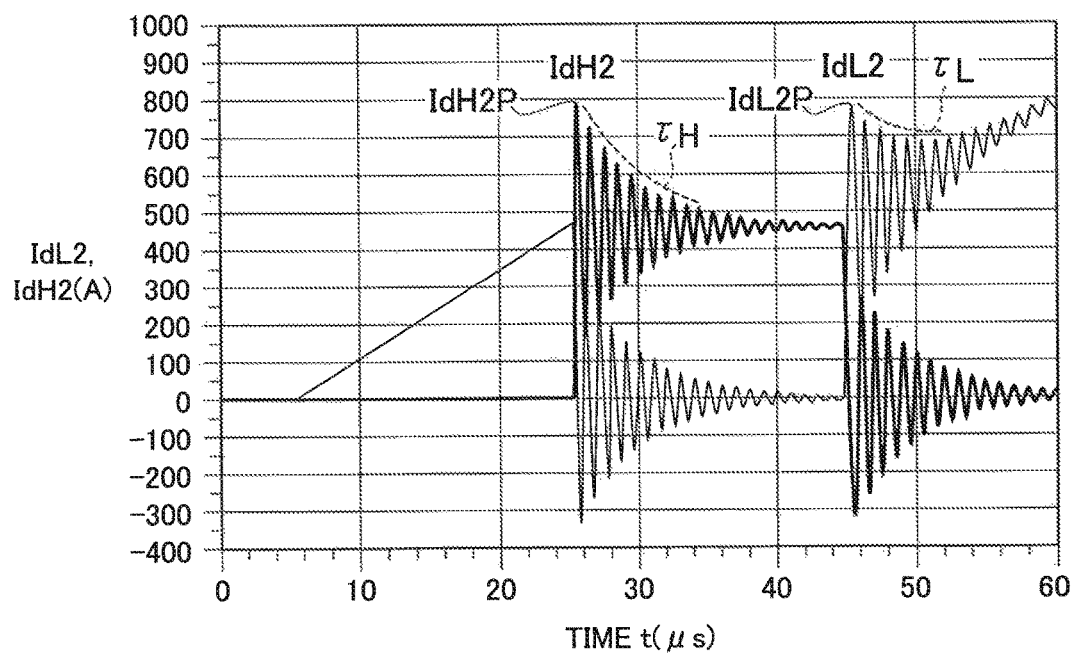
FIG. 7 shows an example of an operating waveform of currents IdH2 and IdL2 conducted to power terminals P and N, without connecting a snubber circuit (RB, CB), in the power circuit including the power module according to the embodiment.
Figure 8:
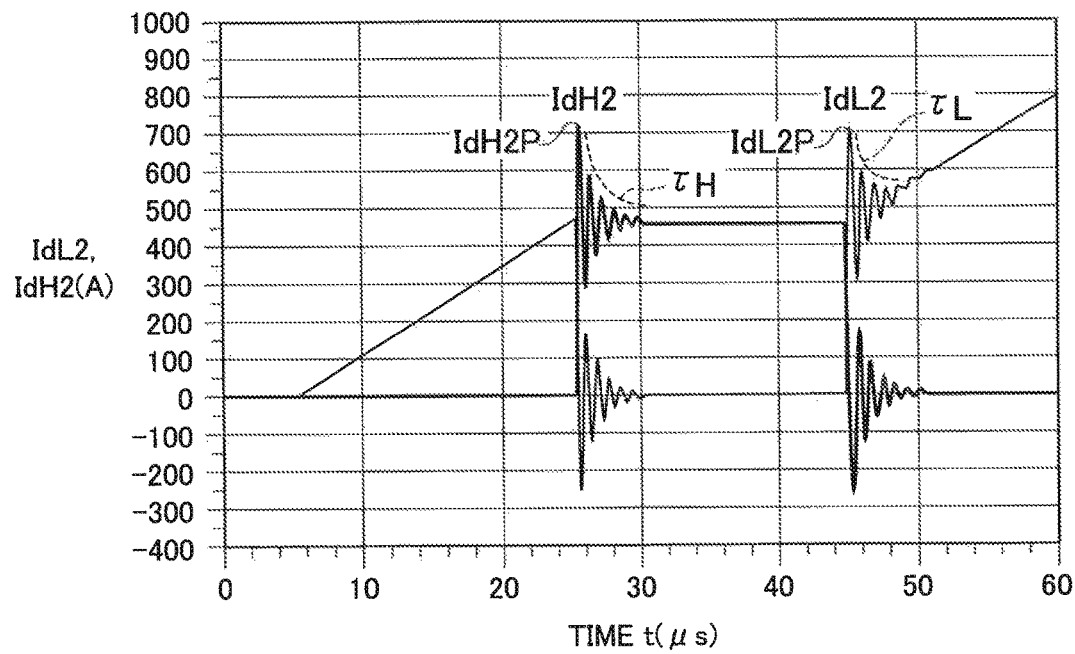
FIG. 8 shows an example of an operating waveform of the currents IdH2 and IdL2 conducted to the power terminals P and N, in a case of connecting a snubber circuit (RB, CB), in the power circuit including the power module according to the embodiment.

FIGS. 7 and 8 show simulation results of the lower-arm-side SiC-MOSFET Q2 being operated by applying 400V to the power source E, and thereby turning off/turning on the lower-arm-side SiC-MOSFET Q2 with a load current of 470 A, in FIG. 6. More specifically, FIGS. 7 and 8 show simulation results of an operating waveform of the currents IdL2 and IdH2 conducted to the power terminals P and N, in a case where the gate terminal GT1 and the source sense terminal SST1 of the higher-arm-side first SiC-MOSFET Q1 is short-circuited to each other, and a pulse voltage is applied between the gate terminal GT2 and the source sense terminal SST2 of the lower-arm-side second SiC-MOSFET Q2 via a gate resistance $R_G$. In this case, FIG. 7 corresponds town example of an operating waveform of the currents IdH2 and IdL2 conducted to the power terminals P and N when not connecting the RC snubber circuit (RB, CB), and FIG. 8 corresponds to an example of an operating waveform of the currents IdH2 and IdL2 conducted to the power terminals P and N when connecting the RC snubber circuit (RB, CB).

Moreover, time constants τH and τL in the current ringing vibration of the currents IdH2 and IdL2 conducted to the power terminals P and N can be obtained on the basis of damping time constants of the envelope curves shown with the dashed lines in FIGS. 7 and 8.

Figure 9:
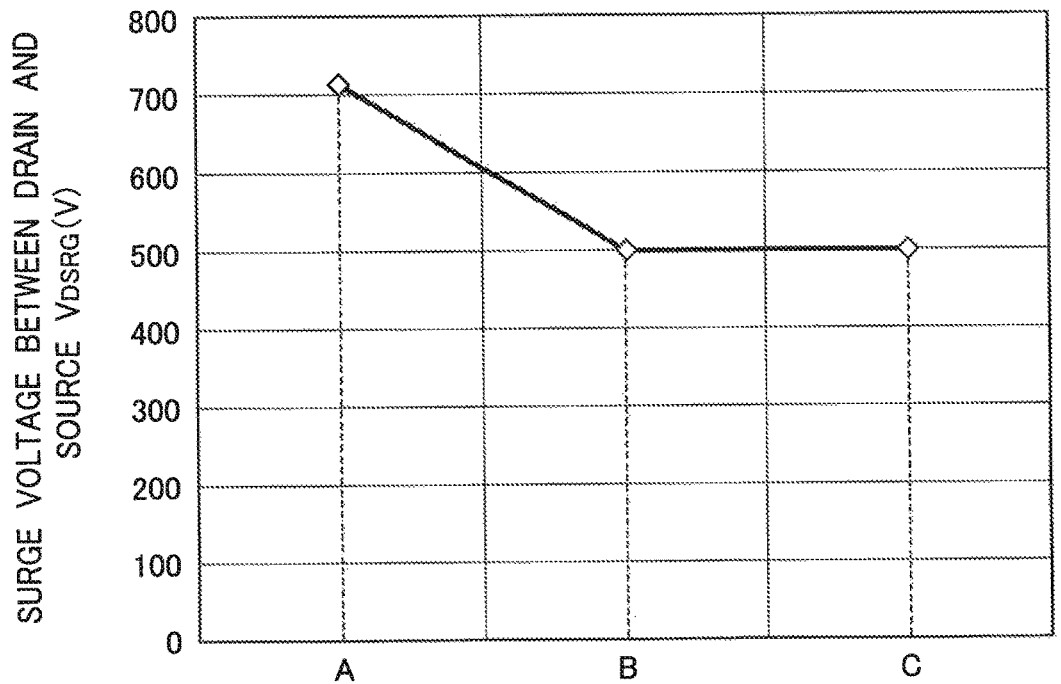
FIG. 9 shows a comparative example of peak values of a surge voltage $V_{DSRG}$ between drain and source: (A) when including no internal capacitor C1; (B) when including an internal capacitor C1, but including no snubber circuit (RB, CB); and (C) when including an internal capacitor C1 and a snubber circuit (RB, CB), in the power circuit including the power module according to the embodiment.

FIG. 9 shows a comparative example of peak values of surge voltage $V_{DSRG}$ between drain and source when performing a simulation of a case where the lower-arm-side SiC-MOSFET Q2 is operated by applying 400V to the power source E, and turning-off/turn-on at the load current 470 A are performed. More specifically, in FIG. 9, reference numeral A denotes a surge voltage $V_{DSRG}$ between drain and source when including no internal capacitor C1, and a value equal to or greater than 700V is obtained, for example. On the other hand, reference numeral B denotes a surge voltage $V_{DSRG}$ between drain and source when including the internal capacitor C1, but including no snubber circuit (RB, CB), and a value of approximately 500V is obtained, for example. Moreover, reference numeral C denotes a surge voltage $V_{DSRG}$ between drain and source when including both of the internal capacitor C1 and the snubber circuit (RB, CB), and a value of approximately 500V is obtained, for example.

Figure 10:
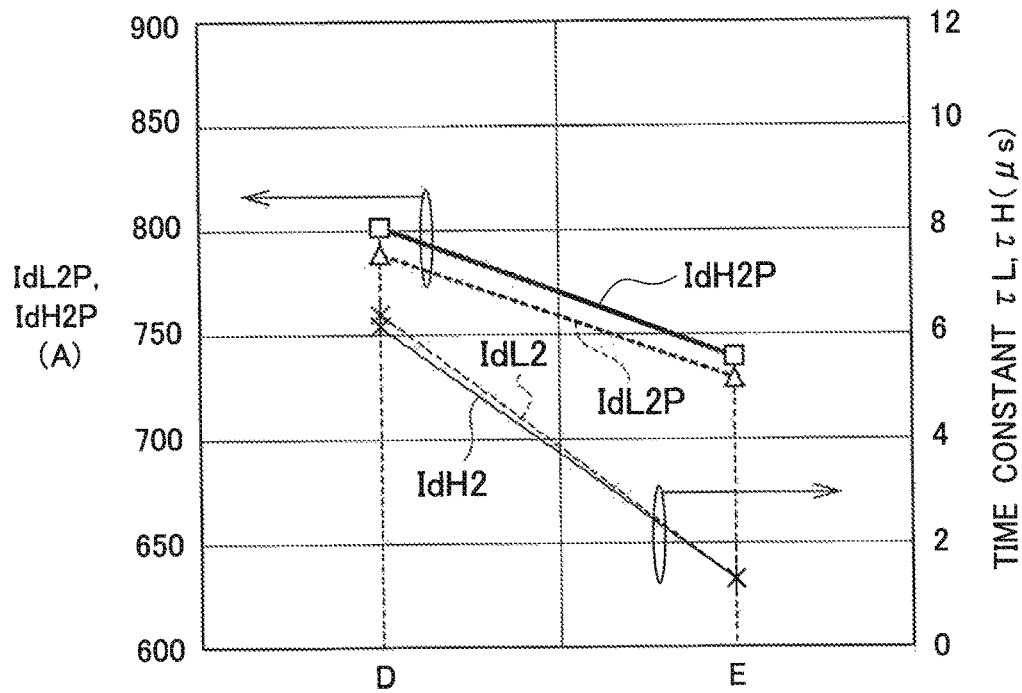
FIG. 10 shows a comparative example of peak values IdH2P and IdL2P of a surge current $I_{DSRG}$ between drain and source and time constants $\tau H$ and $\tau L$ of a current ringing vibration of the currents IdH2 and IdL2 conducted to power terminals P and N: (D) when including an internal capacitor C1, but including no snubber circuit (RB, CB); and (E) when including an internal capacitor C1 and a snubber circuit (RB, CB), in the power circuit including the power module according to the embodiment.

FIG. 10 shows a comparative example of peak values IdH2P and IdL2P of a surge current $I_{DSRG}$ between drain and source of the currents IdH2 and IdL2 conducted to the power terminals P and N, and time constants TH and TL of a current ringing vibration of the currents IdH2 and IdL2. More specifically, in FIG. 10, reference numeral D corresponds to a case of including the internal capacitor C1 but including no snubber circuit (RB, CB), and reference numeral E corresponds to a case of including both of the internal capacitor C1 and the snubber circuit (RB, CB).

In the case of including the internal capacitor C1 but including no snubber circuit (RB, CB), the peak values IdH2P and IdL2P of the surge current $I_{DSRG}$ between drain and source of the currents IdH2 and IdL2 conducted to the power terminals P and N are respectively approximately 800 A and approximately 790 A, and the time constants TH and TL in the current ringing vibration of the currents IdH2 and IdL2 are respectively approximately 6.1 μs and approximately 6.2 μs, for example.

On the other hand, in the case of including both of the internal capacitor C1 and the snubber circuit (RB, CB), the peak values IdH2P and IdL2P of the surge current $I_{DSRG}$ between drain and source of the currents IdH2 and IdL2 conducted to the power terminals P and N are respectively approximately 740 A and approximately 730 A, and the time constants τH and τL in the current ringing vibration of the currents IdH2 and IdL2 are respectively approximately 1.5 μs and approximately 1.5 μs, for example.

Figure 11:
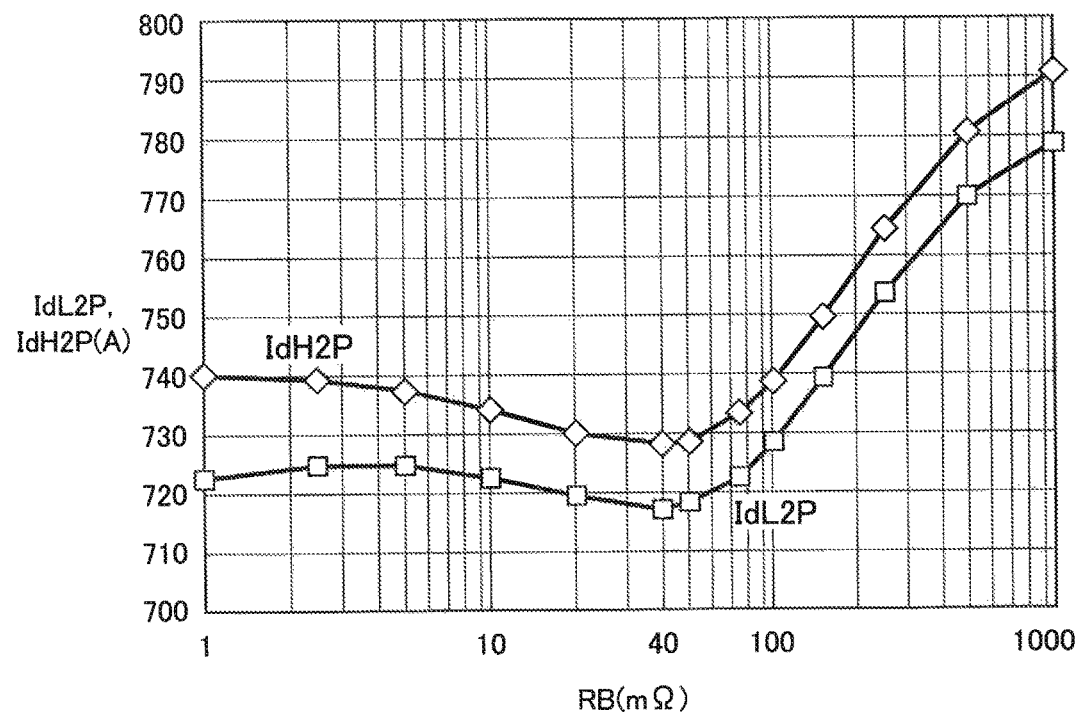
FIG. 11 shows dependency of snubber resistor RB of the peak values IdH2P and IdL2P of the currents IdH2 and IdL2 conducted to the power terminals P and N, in the power circuit including the power module according to the embodiment.

Moreover, FIG. 11 shows dependency of the snubber resistor RB in the peak values IdH2P and IdL2P of the currents IdH2 and IdL2 conducted to the power terminals P and N, in FIG. 6. In FIG. 11, the voltage and current of 400V/470 A is switched with the inductive load, a value of the parasitic inductance $L_{pp}$ between the snubber circuit 4 and the smoothing capacitors C2 is approximately 15 nH, for example, and a value of the parasitic capacitance $C_{pp}$ is approximately 9.3 μF, for example.

As shown in FIG. 11, if the value of the snubber resistor RB is relatively small (e.g., approximately several mΩ), the vibration of the currents IdH2 and IdL2 conducted to the power terminals P and N cannot be effectively decayed, and therefore the peak values IdH2P and IdL2P respectively indicate relatively large values. On the other hand, if the value of the snubber resistor RB is relatively large (e.g., approximately 1000 mΩ), the snubber circuit 4 cannot be operated since it becomes nearer to a high impedance opened state, and therefore, the peak values IdH2P and IdL2P respectively indicate relatively large values. Accordingly, as shown in FIG. 11, it is proved that a resistance value by which the peak values IdH2P and IdL2P substantially are minimized exists in the value of the snubber resistor RB, and 40 mΩ is a value near the optimum value of the snubber resistor RB, in the circuit example shown in FIG. 6 having the above-mentioned numerical example.

As shown in FIGS. 9 and 10, since the snubber circuit 4 is externally connected between a power terminals P and N of a bridge unit 3, the vibration of the current which flows into the power terminals P and N can be quickly converged, even if the internal capacitor C1 is included in the bridge unit 3, without hardly changing the amount of surges of the voltage between the drain and the source applied to the device unit, and thereby the noise can be reduced, and the high-frequency operation can be realized.

In the power circuit 2 including the power module 1 according to the embodiment, an impedance with respect to a current having sharp rising will become high if a capacity of the snubber capacitor CB in the snubber circuit 4 is too small, and thereby it does not function as a current path. Accordingly, the capacity of the snubber capacitor CB is preferable to be equal to or greater than the capacity of the internal capacitor C1.

Moreover, in the power circuit 2 including the power module 1 according to the embodiment, if a resistance value of the snubber resistor RB in the snubber circuit 4 is too small, a time constant of ringing will become long and therefore an effect of decaying vibration cannot be obtained. On the other hand, if the resistance value of the snubber resistor RB is too large, the current flows through another path, and therefore an effect of decaying vibration cannot also be obtained.

The resistance value of the snubber resistor RB is preferable to be a value near a characteristic impedance $(Z_o = L_{pp}/C_{pp})^{1/2}$ expressed with the parasitic capacitance $C_{pp}$ and the parasitic inductance $L_{pp}$ in the closed loop of the snubber circuit 4 and the smoothing capacitor C2 among the closed loops in which the ringing occurs. For example, in a case of a closed loop of which the parasitic inductance $L_{pp}$ is 15 nH and the parasitic capacitance $C_{pp}$ is 9.3 μF, the characteristic impedance $Z_o$ is as follows: a resistance value is approximately 40 mΩ. Accordingly, the influence of the current ringing vibration which occurs between the smoothing capacitor C2 and the snubber circuit 4 exerted on the bridge unit 3 side can be reduced, and thereby the current surge can be controlled.

According to the embodiment, there can be provided the power module and the power circuit which can simultaneously realize the low parasitic inductance and the low noise.

(Modified Examples)

Figure 12:
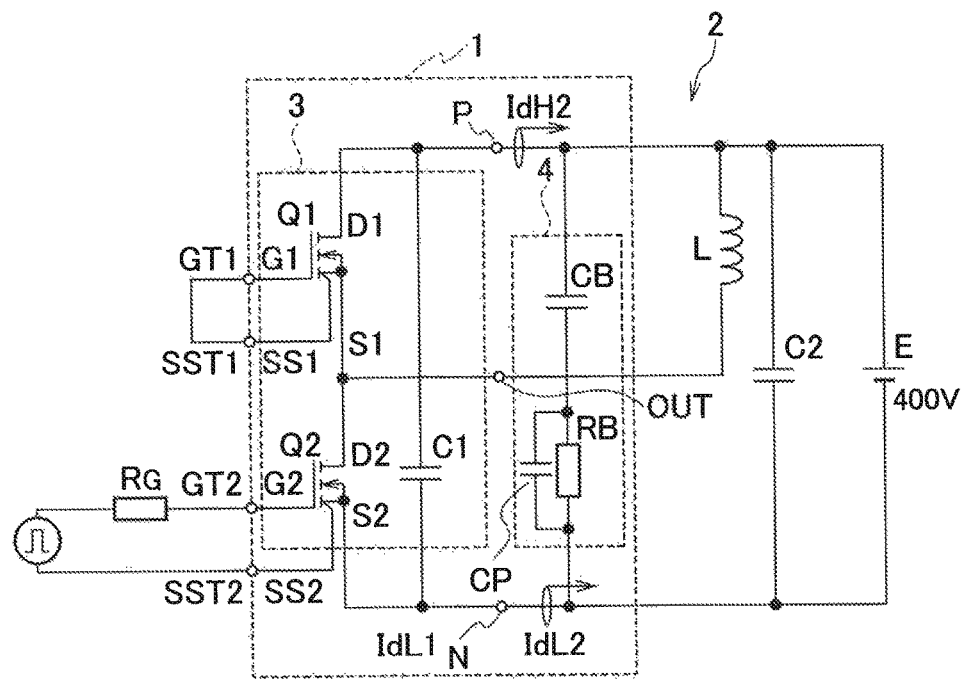
FIG. 12 is a schematic circuit configuration diagram of a half bridge circuit, which is a power circuit including a power module according to a modified example of the embodiment.

FIG. 12 shows a schematic circuit configuration of a half bridge circuit, which is a power circuit 2 including a power module 1 according to a modified example of the embodiment. In addition, also the power circuit 2 including the power module 1 according to the modified example of the embodiment is not limited to such a half bridge circuit, but can be applied also in full bridge circuits or three-phase bridge circuits.

As shown in FIG. 12, the power circuit 2 including the power module 1 according to the modified example of the embodiment includes: a bridge unit 3 including a bridge circuit composed including a plurality of SiC-MOSFETs Q1 and Q2 and an internal capacitor C1 connected so as to extend over between both ends of the bridge circuit; power terminals P and N of which one ends are respectively connected to both ends of the bridge unit 3 and other ends are respectively exposed to the outside; and a snubber circuit 4 connected in series so as to extend over between the respective exposed sides of the power terminals P and N.

Moreover, as shown in FIG. 12, the power circuit 2 including the power module 1 according to the modified example of the embodiment may include a smoothing capacitor C2 connected in parallel to the snubber circuit 4.

As shown in FIG. 12, in the power circuit 2 including the power module 1 according to the modified example of the embodiment, the snubber circuit 4 may include a snubber capacitor CB and a snubber resistor RB connected in series to each other, and may further include a parallel capacitor CP connected in parallel to the snubber resistor RB.

Moreover, the bridge unit 3 may include any one of a half bridge circuit, a full bridge circuit, or a three-phase bridge circuit, and the internal capacitor C1 may connect a different capacitor for a plurality of respective bridges.

The power circuit 2 including the power module 1 according to the modified example of the embodiment includes the parallel capacitor CP connected in parallel to the snubber resistor RB composing the snubber circuit 4. Other configurations are the same as those of the embodiment.

In the power circuit 2 including the power module 1 according to the modified example of the embodiment, the current flows not through the snubber resistor RB but through the parallel capacitor CP at a moment when the current change is relatively large immediately after switching, by inserting the parallel capacitor CP in parallel to the snubber resistor RB of the snubber circuit 4. Thus, the impedance of the snubber circuit 4 in particular immediately after switching can be apparently reduced.

Accordingly, the snubber circuit 4 can share a supply source of the load current, an amount of discharging current from an internal capacitor C1 can be reduced, and thereby the current surge which occurs at the time of recharging to the internal capacitor C1 can be reduced.

Figure 13:
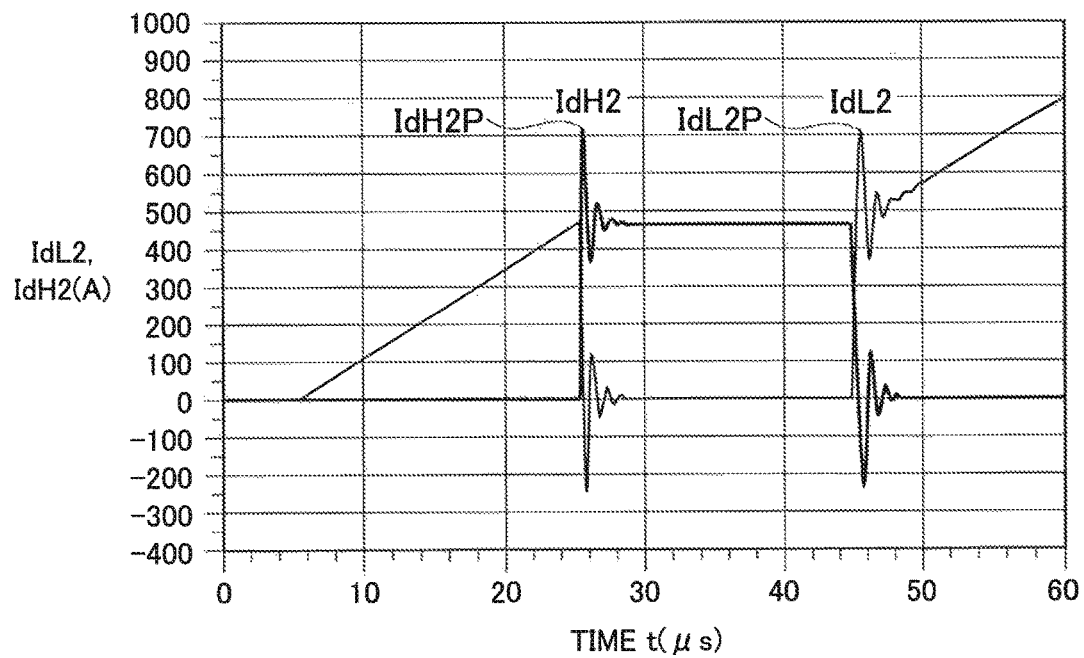
FIG. 13 shows an example of an operating waveform of currents IdH2 and IdL2 conducted the power terminals P and N when connecting a snubber circuit (RB, CB) and a parallel capacitor CP, in the power circuit including the power module according to the modified example of the embodiment.

FIG. 13 shows an example of operation simulation waveform of currents IdH2 and IdL2 conducted to the power terminals P and N when connecting the snubber circuit 4 and the parallel capacitor CP, in the power circuit 2 including the power module 1 according to the modified example of the embodiment.

Figure 14:
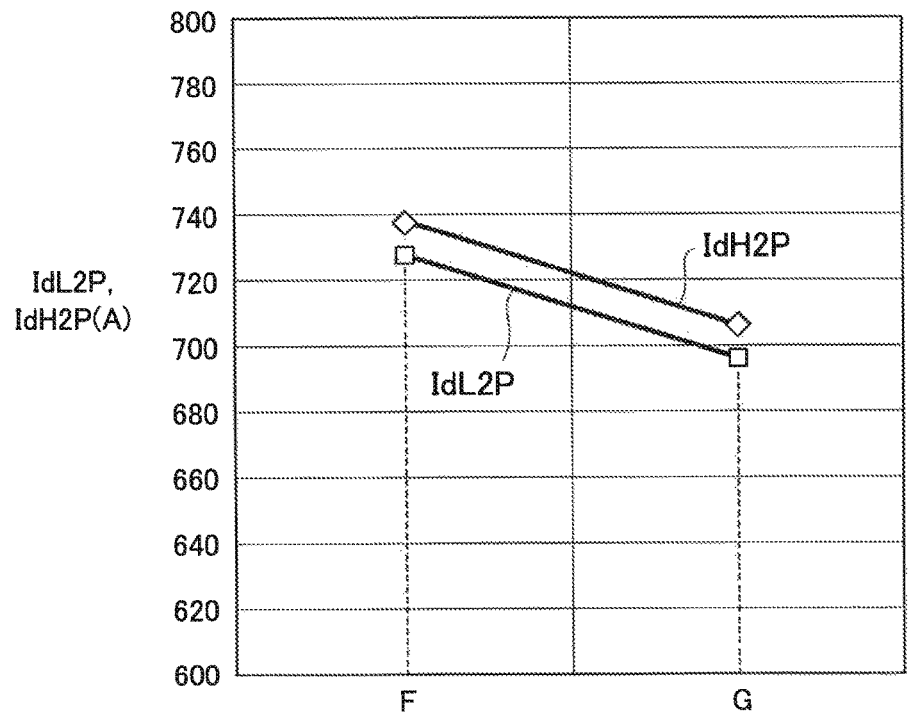
FIG. 14 shows a comparative example of the peak values IdH2P and IdL2P of the surge current $I_{DSRG}$ between drain and source of currents IdH2 and IdL2 conducted to the power terminals P and N: (F) when including no parallel capacitor CP; and (G) including the parallel capacitor CP, in the power circuit including the power module according to the modified example of the embodiment.

Moreover, FIG. 14 shows a comparative example of peak values IdL2P and IdH2P of the currents IdH2 and IdL2 conducted to the power terminals P and N. More specifically, in FIG. 14, reference numeral F denotes the peak values IdH2P and IdL2P when including no parallel capacitor CP, and values of approximately 735 A and approximately 725 A are respectively obtained as the peak values IdH2P and IdL2P, for example. On the other hand, a reference numeral G denotes the peak values IdH2P and IdL2P when including the parallel capacitor CP, and values of approximately 710 A and approximately 695 A are obtained as the peak values IdH2P and IdL2P, for example.

As shown in FIG. 12, in the case where the parallel capacitor CP is inserted in parallel to the snubber resistor RB of the snubber circuit 4, a current which flows into the snubber circuit 4 flows not through the snubber resistor RB but through the parallel capacitor CP when the current is sharply changed at a moment of switching. Accordingly, the impedance can be apparently reduced. Thus, since the parallel capacitor CP has a large role of the supply source of the load current, an outflow of charge from the internal capacitor C1 can be controlled, and thereby the peak value of the current surge can be reduced, and also converging of the ringing can further be accelerated, as shown in FIG. 13.

As for the resistance value of the snubber resistor RB in this time, the combined impedance is reduced by the parallel capacitor CP connected in parallel thereto. Accordingly, the value of the snubber resistor RB in the power circuit 2 according to the modified example of the embodiment may have a resistance value which is appropriately increased, compared with the value of the snubber resistor RB in the power circuit 2 according to the embodiment.

According to the modified example of the embodiment, there can be provided the power module and the power circuit which can simultaneously realize the low parasitic inductance and the low noise.

(Example 1 of Internal Structure of Power Module)

Figure 15:
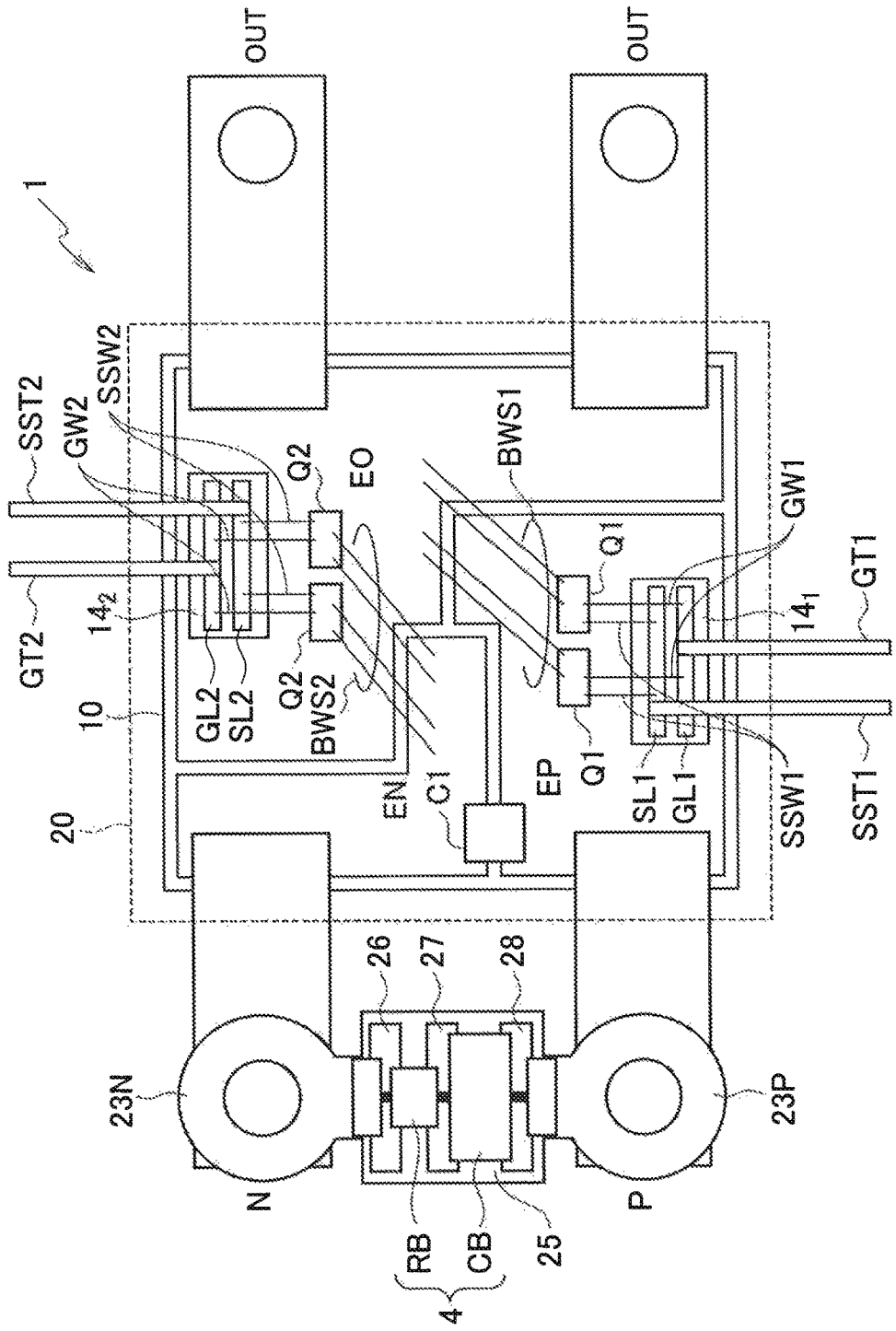
FIG. 15 is a schematic top view diagram before forming a resin layer, in an example including the internal capacitor C1 and the externally connected snubber circuit (RB, CB), which is an example 1 of an internal structure of the power module according to the embodiment.

FIG. 15 shows a schematic top view before forming a resin layer 20, in an example including the internal capacitor C1 and the externally connected snubber circuit (RB, CB) 4, which is an example 1 of an internal structure of the power module 1 according to the embodiment.

Figure 16:
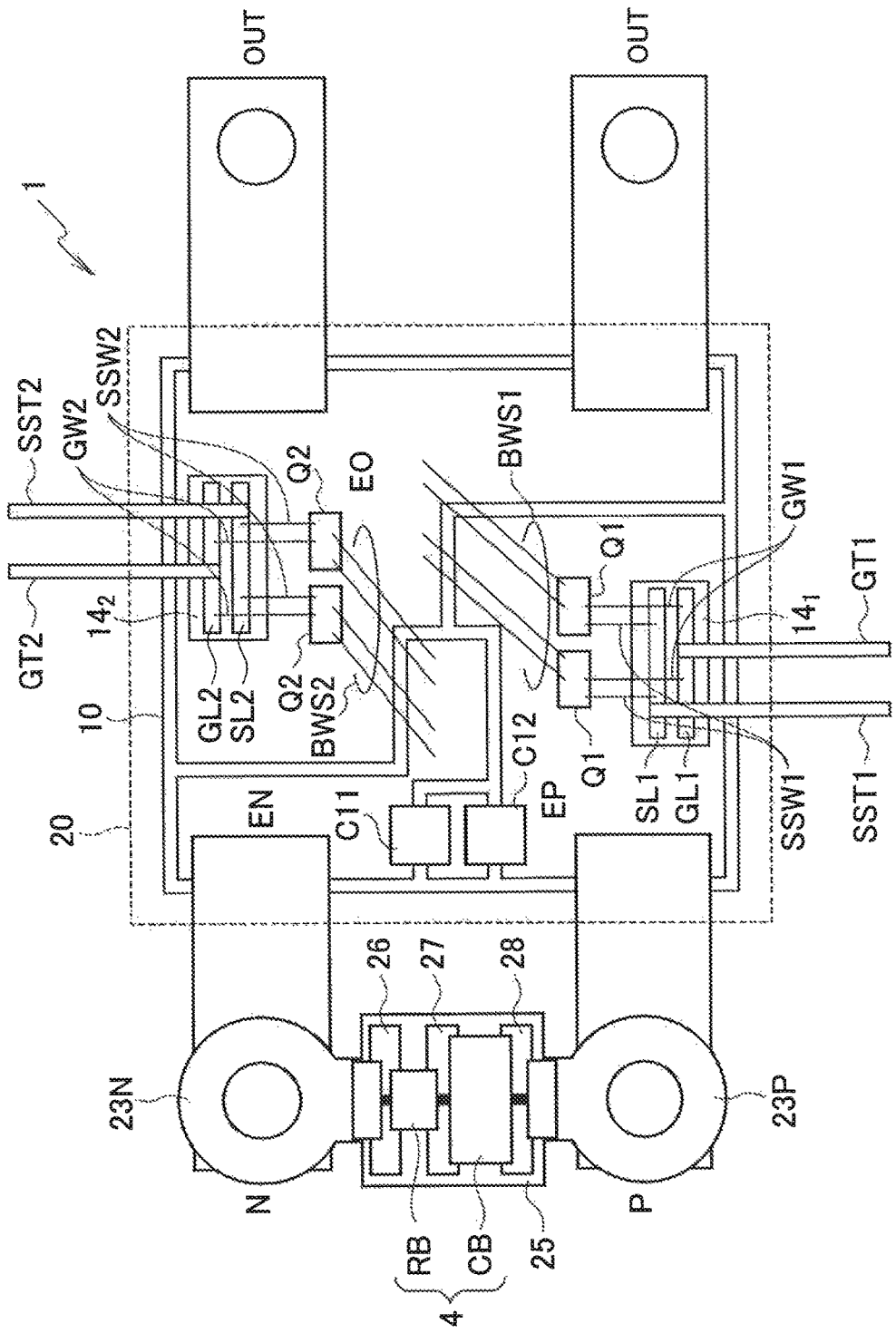
FIG. 16 is a schematic top view diagram before forming the resin layer, in an example including internal capacitors C11 and C12 and the externally connected snubber circuit (RB, CB), which is a modified example of the example 1 of the internal structure of the power module according to the embodiment.

Moreover, FIG. 16 shows a schematic top view before forming the resin layer 20, in an example including internal capacitors C11 and C12 and the externally connected snubber circuit (RB, CB) 4, which is a modified example of the example 1 of the internal structure of the power module 1 according to the embodiment.

Figure 17:
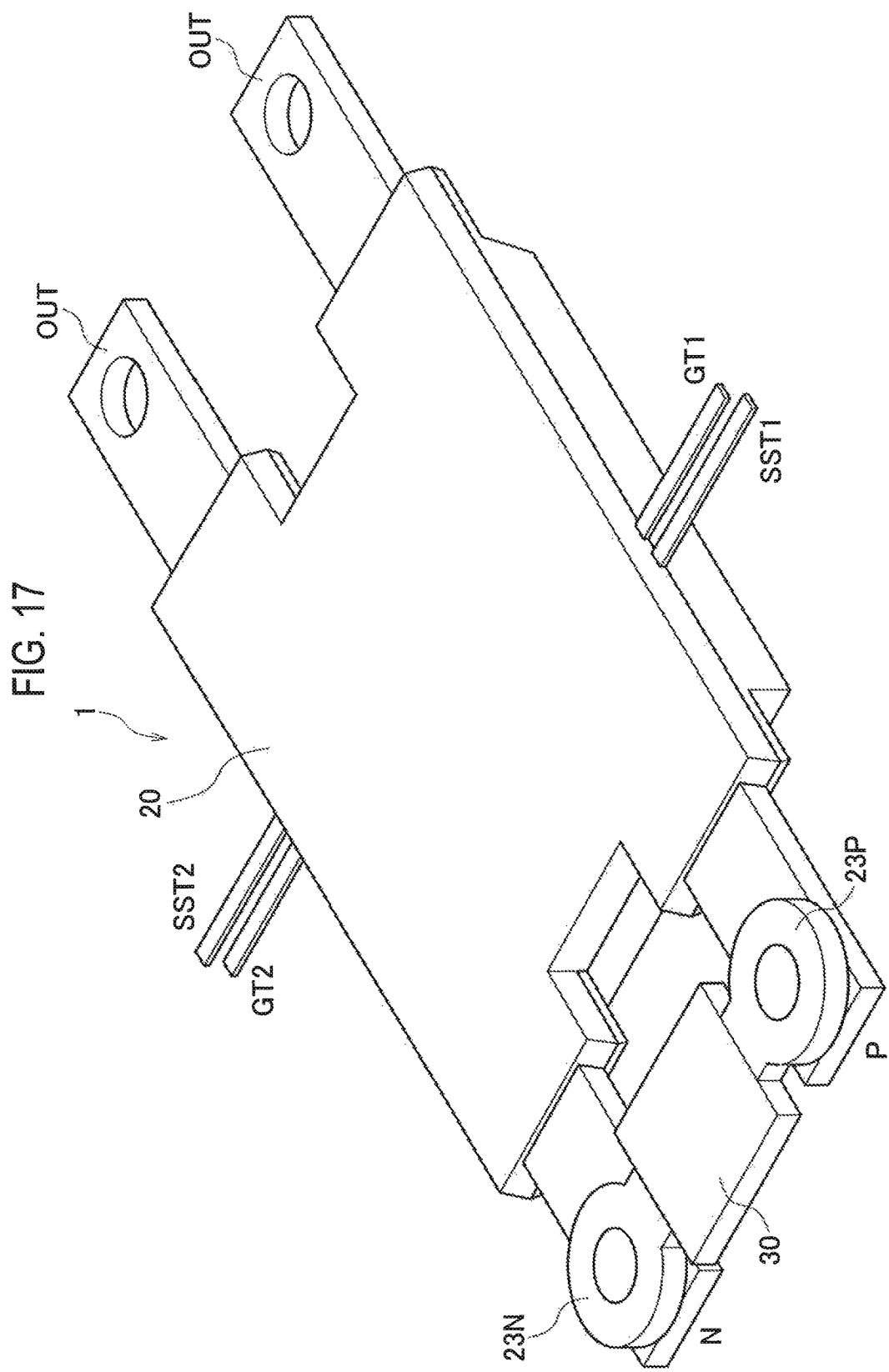
FIG. 17 is a schematic bird's-eye view configuration diagram after forming the resin layer, in the power module according to the embodiment.

FIG. 17 shows a schematic bird's-eye view configuration after forming the resin layer 20, in the power module 1 according to the embodiment. The power module 1 according to the embodiment can be formed by transfer molding, as shown in FIG. 17.

As shown in FIGS. 15-16, the power module 1 according to the embodiment includes: a main substrate 10; a first electrode pattern EP disposed on the main substrate 10, the first electrode pattern EP connected to a positive-side power terminal P; a second electrode pattern EN disposed on the main substrate 10, the second electrode pattern EN connected to a negative-side power terminal N; a third electrode pattern EO disposed on the main substrate 10, the third electrode pattern EO connected to an output terminal OUT; a first SiC-MOSFET Q1 of which a first drain D1 is disposed on the first electrode pattern EP; a second SiC-MOSFET Q2 of which a second drain D2 is disposed on the third electrode pattern EO; an internal capacitor C1 disposed between the first electrode pattern EP and the second electrode pattern EN; and a snubber circuit 30 (FIG. 17) connected so as to extend over between a side of the positive-side power terminal P exposed to the outside from a resin layer 20 and a side of the negative-side power terminal N exposed to the outside from the resin layer 20.

Although illustration is omitted, a smoothing capacitor C2 connected in parallel to the snubber circuit 30 may be included therein.

Moreover, the internal capacitor C1 may be composed including a plurality of internal capacitors C11 and C12 connected in series to each other, as shown in FIG. 16.

The snubber circuit 30 may include a snubber resistor RB and a snubber capacitor CB connected in series to each other, as shown in FIGS. 15 and 16. In addition, in the snubber circuit 30, as shown in FIGS. 15 and 16, the snubber resistor RB and the snubber capacitor CB may be connected in series to each other via a plurality of electrode patterns 26, 27 and 28 mounted on the snubber circuit substrate 25.

As shown in FIGS. 15-17, the power module 1 according to the embodiment may include a first metallic plate 23P connected to the positive-side power terminal P, and a second metallic plate 23N connected to the negative-side power terminal N, wherein the snubber circuit 30 may be disposed between the first metallic plate 23P and the second metallic plate 23N. The positive-side power terminal P and the first metallic plate 23P may be screwed and connected to each other, and the negative-side power terminal N and the second metallic plate 23N may also be screwed and connected to each other.

Moreover, as shown in FIGS. 15 and 16, the power module 1 according to the embodiment may include a first signal substrate $14_1$ disposes on the main substrate 10, the first signal substrate $14_1$ configured to mount a signal wiring pattern GL1 for first gate connected to a first gate G1 of the first SiC-MOSFET Q1 and a signal wiring pattern SL1 for first source sense connected to a first source S1 of the first SiC-MOSFET Q1.

Similarly, the power module 1 according to the embodiment may include a second signal substrate $14_2$ disposes on the main substrate 10, the second signal substrate $14_2$ configured to mount a signal wiring pattern GL2 for second gate connected to a second gate G2 of the second SiC-MOSFET Q2, and a signal wiring pattern SL2 for second source sense connected to a second source S2 of the second SiC-MOSFET Q2.

Moreover, at least one portion of a sealing unit of the power module 1 according to the embodiment may be sealed with a thermosetting resin.

Moreover, the power module 1 according to the embodiment may be formed by transfer molding.

Moreover, transfer mold resins, thermosetting resins, etc. applicable to the SiC based semiconductor device can be used as the resin layer 20 (FIG. 17). Silicone based resins, e.g. silicone gel, may be partially used therefor, or case-type power modules using silicone based resins, e.g. silicone gel, may be adopted thereto.

In the power circuit 2 including the power module 1 according to the embodiment, the power terminals P and N can be excepted from the closed loop which affects on voltage surges by externally connecting the snubber circuit 4 so as to extend over between both ends of the power terminals P and N; and vibration of the currents IdH2 and IdL2 conducted to the power terminals P and N can also be controlled. Therefore, as shown in FIGS. 15-17, according to the power module 1 according to the embodiment, the noise can be reduced also in the transfer-mold type power module which is difficult to reduce the parasitic inductance at a peripheral portion of the power terminals P and N; and an amount of surge voltage can be greatly improved.

As shown in FIG. 15, the power module 1 according to the embodiment may include a ceramic substrate 10, and the internal capacitor C1 may be disposed so as to extend over between the different electrode patterns EP and EN formed on the ceramic substrate 10.

Moreover, the internal capacitor C1 may be composed including a plurality of internal capacitors C11 and C12 connected in series to each other, as shown in FIG. 16. When installing a plurality of the internal capacitors C11 and C12 in the power module 1, assembly will be easily achieved if the internal capacitors C11 and C12 are bonded to electrode patterns on the ceramic substrate 10. Since the internal capacitor C1 is formed by connecting the plurality of the internal capacitors C11 and C12 in series, the parasitic resistance and parasitic inductance are appropriately increased while securing a breakdown voltage, and thereby sharp changes of the current are prevented in a case of occurrence of the supply and inflow of the load. As a result, the current surge can be reduced.

FIGS. 15 and 16 respectively show examples of two chips of the SiC-MOSFETs Q1 and Q2 arranged in parallel.

As shown in FIGS. 15-17, the power module 1 according to the embodiment includes: a positive-side power terminal P and a negative-side power terminal N disposed at a first side of the ceramic substrate 10 covered with the resin layer 20; a gate terminal GT1 and a source sense terminal SST1 disposed at a second side adjacent to the first side; output terminals OUT and OUT disposed at a third side opposite to the first side; and a gate terminal GT4 and a source sense terminal SST4 disposed at a fourth side opposite to the second side. In the embodiment, the gate terminal GT1 and the source sense terminal SST1 are respectively connected to the signal wiring pattern GL1 for gate and the signal wiring pattern SL1 for source in the SiC-MOSFET Q1; and the gate terminal GT2 and the source sense terminal SST2 are respectively connected to the signal wiring pattern GL2 for gate and the signal wiring pattern SL2 for source in the SiC-MOSFET Q2.

As shown in FIGS. 15 and 16, wires GW1 and GW2 for gate and wires SSW1 and SSW2 for source sense are respectively connected from the SiC-MOSFETs Q1 and Q2 toward the signal wiring patterns GL1 and GL2 for gate and the signal wiring patterns SL1 and SL2 for source sense disposed on the signal substrates $14_1$ and $14_2$. Moreover, the gate terminals GT1 and GT2 for external extraction and the source sense terminals SST1 and SST2 are respectively connected to the signal wiring patterns GL1 and GL2 for gate and the signal wiring patterns SL1 and SL2 for source sense by soldering etc.

In the examples shown in FIGS. 15 and 16, source pad electrodes SP1 and SP2 on chip surfaces of two chips of the SiC-MOSFETs Q1 and Q2 disposed in parallel to each other are respectively connected to electrode patterns EO and EN via bonding wires BWS1 and BWS2 for source. The source pad electrodes SP1 and SP2 on the chip surfaces of two chips of the SiC-MOSFETs Q1 and Q2 disposed in parallel may be connected in common by adopting a metal spacer and an upper surface plate electrode thereto, instead of the bonding wires BWS1 and BWS2 for source. In this case, the source pad electrodes SP1 and SP2 are similar to the source pad electrode SP shown in FIGS. 21 and 22, for example.

The positive-side power terminal P and negative-side power terminal N, and the gate terminals GT1 and GT2 and source sense terminals SST1 and SST2 for external extraction can be formed including Cu, for example.

The main substrate 10 can be formed including a ceramic substrate. For example, the ceramic substrate may be formed of $Al_2O_3$, AlN, SiN, AlSiC, or SiC of which at least the surface is insulation.

The electrode patterns EP, EO and EN can be formed including Cu, Al, etc., for example.

The wires GW1 and GW2 for gate, the wires SSW1 and SSW2 for source sense, and the bonding wires BWS1 and BWS2 for source can be formed including Al, AlCu, etc., for example.

As the SiC-MOSFETs Q1 and Q2, SiC-DIMOSFET, SiC-TMOSFET, etc. which are mentioned below are applicable. Alternatively, instead of the SiC based power device, GaN based power devices, e.g. GaN based High Electron Mobility Transistor (HEMT), are applicable.

As the snubber capacitor CB, ceramic capacitors etc. are applicable.

(Example 2 of Internal Structure of Power Module)

Figure 18:
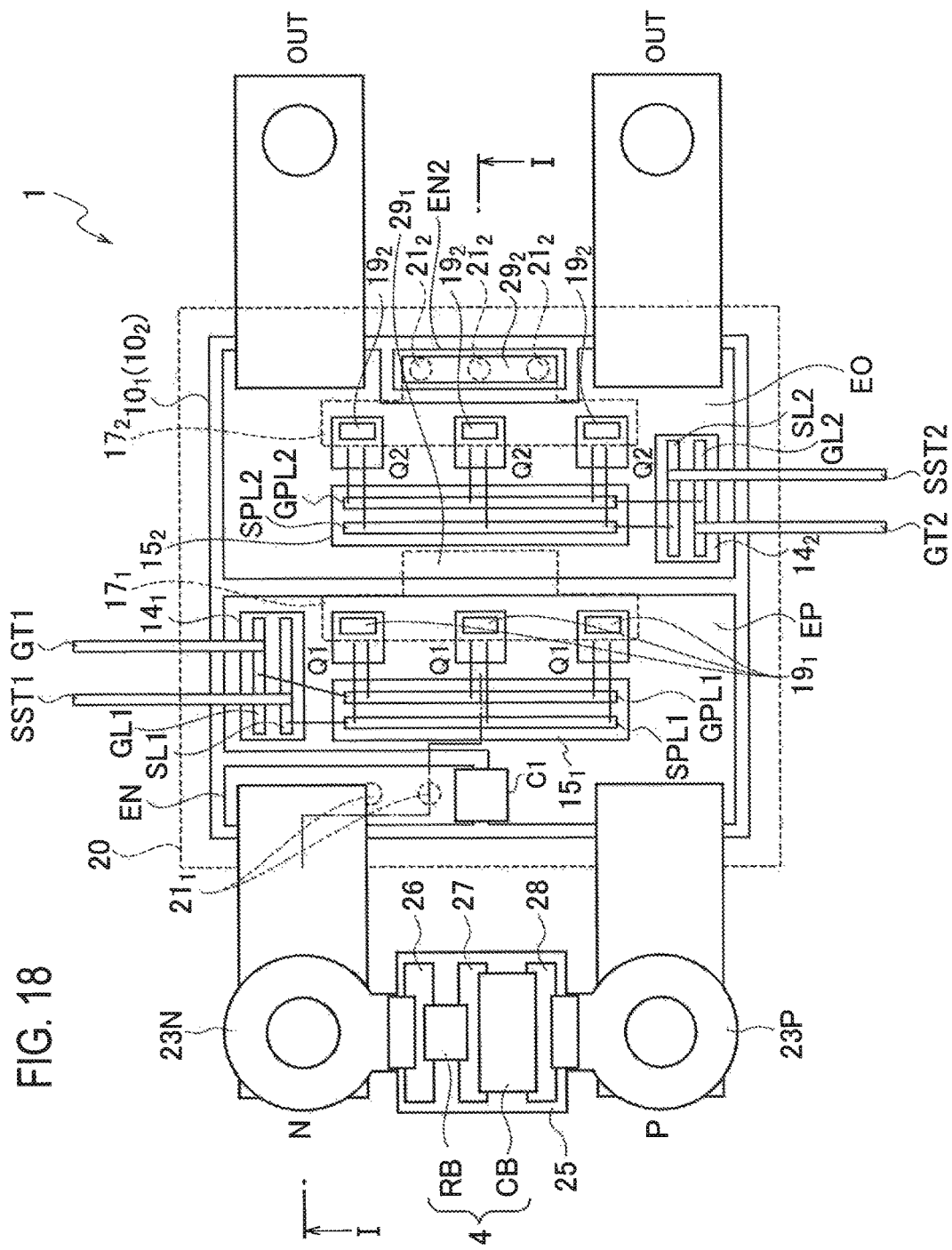
FIG. 18 is a schematic top view diagram before forming a resin layer, in an example including the internal capacitor C1 and the externally connected snubber circuit (RB, CB), which is an example 2 of the internal structure of the power module according to the embodiment.
Figure 19:
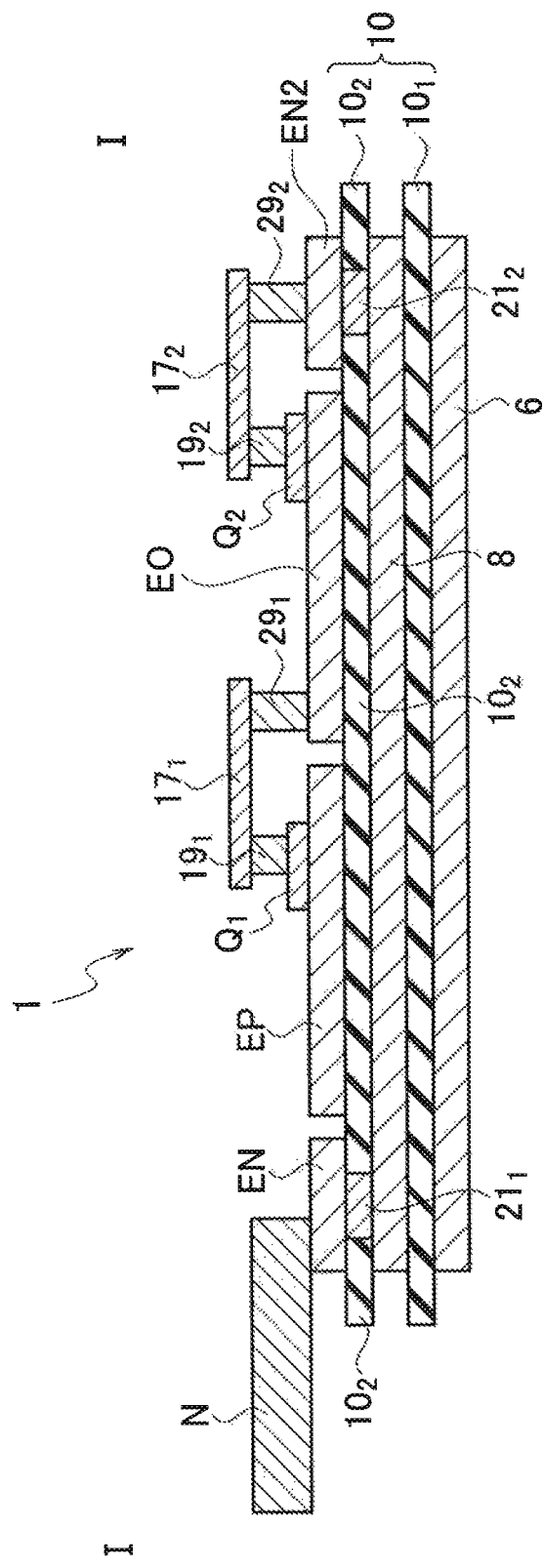
FIG. 19 is a schematic cross-sectional structure diagram taken in the line I-I of FIG. 18.

FIG. 18 shows a schematic top view diagram before forming a resin layer 20, in an example including the internal capacitor C1 and the externally connected snubber circuit (RB, CB) 4, which is an example 2 of an internal structure of the power module 1 according to the embodiment. Moreover, FIG. 19 shows a schematic cross-sectional structure taken in the line I-I of FIG. 18. A schematic bird's-eye view configuration after forming the resin layer is similarly shown as FIG. 17, and can be formed by transfer molding.

FIG. 18 shows an example of three chips of the SiC-MOSFETs Q1 and Q2 arranged in parallel.

In the power module 1 according to another embodiment, as shown in FIGS. 18 and 19, the main substrate 10 includes a multilayered structure of ceramic substrates $10_1$ and $10_2$. A metallic foil 6 is formed on a back side surface of the ceramic substrate $10_1$, and a metallic foil 8 is formed on a front side surface of the ceramic substrate $10_1$. The ceramic substrate $10_2$ is disposed on the metallic foil 8.

As shown in FIGS. 18 and 19, the power module 1 according to the other embodiment includes: a ceramic substrate $10_2$; a first electrode pattern EP disposed on the ceramic substrate $10_2$, the first electrode pattern EP connected to a positive-side power terminal P; a second electrode pattern EN disposed on the ceramic substrate $10_2$, the second electrode pattern EN connected to a negative-side power terminal N; a third electrode pattern EO disposed on the ceramic substrate $10_2$, the third electrode pattern EO connected to an output terminal OUT; a first SiC-MOSFET Q1 of which a first drain D1 is disposed on the first electrode pattern EP; a second SiC-MOSFET Q2 of which a second drain D2 is disposed on the third electrode pattern EO; an internal capacitor C1 disposed between the first electrode pattern EP and the second electrode pattern EN; and a snubber circuit 30 connected so as to extend over between a side of the positive-side power terminal P exposed to the outside from a resin layer 20 and a side of the negative-side power terminal N exposed to the outside from the resin layer 20.

Moreover, as shown in FIGS. 18 and 19, the power module 1 may include: a first signal substrate $15_1$ disposes on the ceramic substrate $10_2$, the first signal substrate $15_1$ configured to mount a signal wiring pattern GL1 for gate connected to a first gate G1 of the first SiC-MOSFET Q1 and a signal wiring pattern SL1 for source sense connected to a first source S1 of the first SiC-MOSFET Q1; and a signal substrate $14_1$ configured to mount a signal wiring pattern GL1 for gate connected to a signal wiring pattern GPL1 for gate and a signal wiring pattern SL1 for source sense connected to a signal wiring pattern SPL1 for source sense.

Similarly, the power module 1 may include: a first signal substrate $15_2$ disposes on the ceramic substrate $10_2$, the second signal substrate $15_2$ configured to mount a signal wiring pattern GPL2 for gate connected to a second gate G2 of the second SiC-MOSFET Q2, and a signal wiring pattern SPL2 for source sense connected to a second source S2 of the second SiC-MOSFET Q2; and a signal substrate $14_2$ configured to mount a signal wiring pattern GL2 for gate connected to a signal wiring pattern GPL2 for gate and a signal wiring pattern SL2 for source sense connected to a signal wiring pattern SPL2 for source sense.

Moreover, as shown in FIGS. 18 and 19, a bus bar electrode $17_1$ on the upper surface of the chip is disposed via respective spacer electrode $19_1$ on chip on respective first sources S1 of the respective first SiC-MOSFETs Q1, and respective source pad electrodes SP1 of the respective first sources S1 of the three first SiC-MOSFETs Q1 are connected in common. Similarly, a bus bar electrode $17_2$ on the upper surface of the chip is disposed via respective spacer electrodes $19_2$ on chip on respective second source S2 of the respective second SiC-MOSFETs Q2, and respective source pad electrodes SP2 of the respective second sources S2 of the three second SiC-MOSFETs Q2 are connected in common.

Moreover, as shown in FIGS. 18 and 19, the bus bar electrode $17_1$ on the upper surface of the chip is connected to a third electrode pattern EO via a spacer electrode $29_1$, and the bus bar electrode $17_2$ on the upper surface of the chip is connected to a fourth electrode pattern EN2 via a spacer electrode $29_2$.

Moreover, as shown in FIGS. 18 and 19, the second electrode pattern EN is connected to the metallic foil 8 on the front side surface of the ceramic substrate $10_1$ via a via hole $21_1$, and the fourth electrode pattern EN2 is connected to the metallic foil 8 on the front side surface of the ceramic substrate $10_1$ via a via hole $21_2$. Other configurations, materials of respective units, etc. are similar to those of the example 1 of the internal structure of the power module 1 according to the embodiment.

Figure 20:
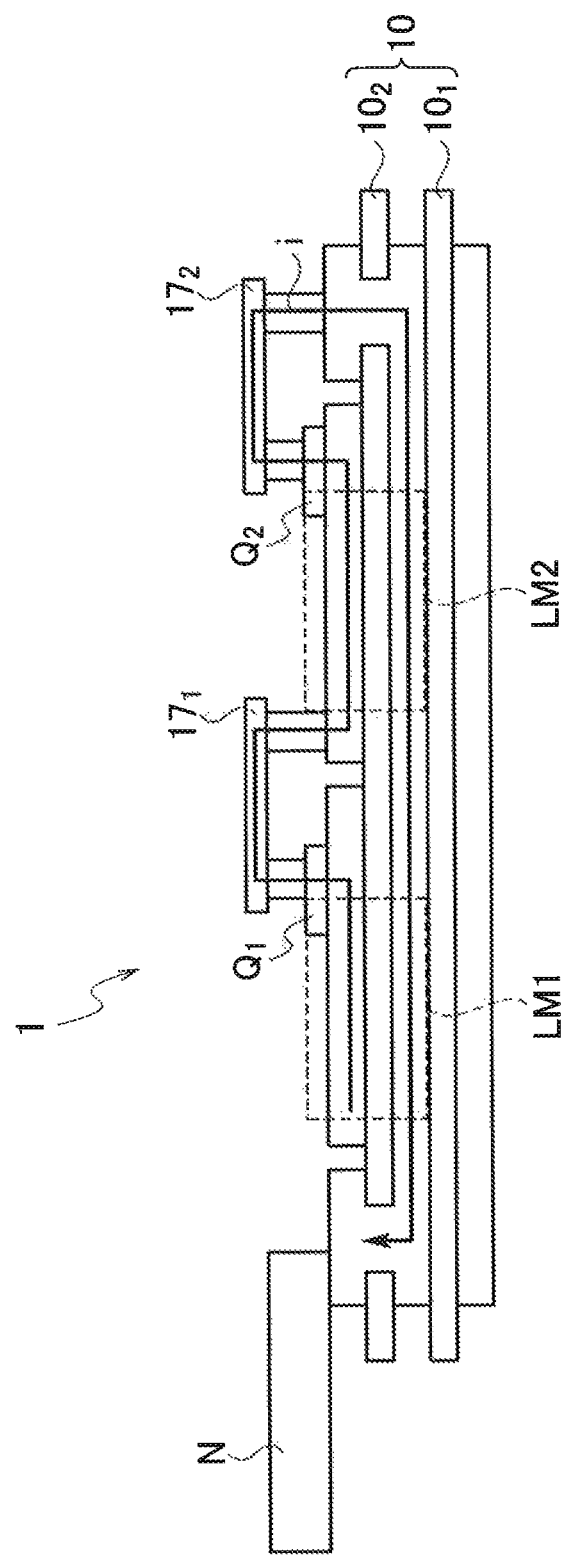
FIG. 20 is a schematic diagram for explaining an aspect of a current cancellation with laminated wiring, in the example 2 of the internal structure of the power module according to the embodiment.

FIG. 20 shows a schematic diagram for explaining an aspect of a current cancellation with laminated wiring structures LM1 and LM2, in the example 2 of the internal structure of the power module 1 according to the embodiment shown in FIGS. 18 and 19.

In the example 2 of the internal structure of the power module 1 according to the embodiment, the laminated wiring structures LM1 and LM2 are formed by providing the laminated ceramic substrates $10_1$ and $10_2$, because of the internal structure of the power module 1. Accordingly, a magnetic flux which occurs due to a parasitic inductance component accompanying the internal wirings of the power module 1 can be canceled by a conductive current i as shown in FIG. 20. As a result, the parasitic inductance accompanying the internal wirings of the power module 1 can be reduced. Such a reduction effect of the parasitic inductance can be obtained also to the laminated wiring structure formed with a current path which passes through both of the bus bar electrodes $17_1$, $17_2$ and the metallic foil 8.

The parasitic inductance in the substrate can be reduced, in the example 2 of the internal structure of the power module 1 according to the embodiment. Accordingly, the parasitic inductance of the ringing loop in the power module can be minimized.
(Configuration Example of Semiconductor Device)
—SiC-DIMOSFET—

Figure 21:
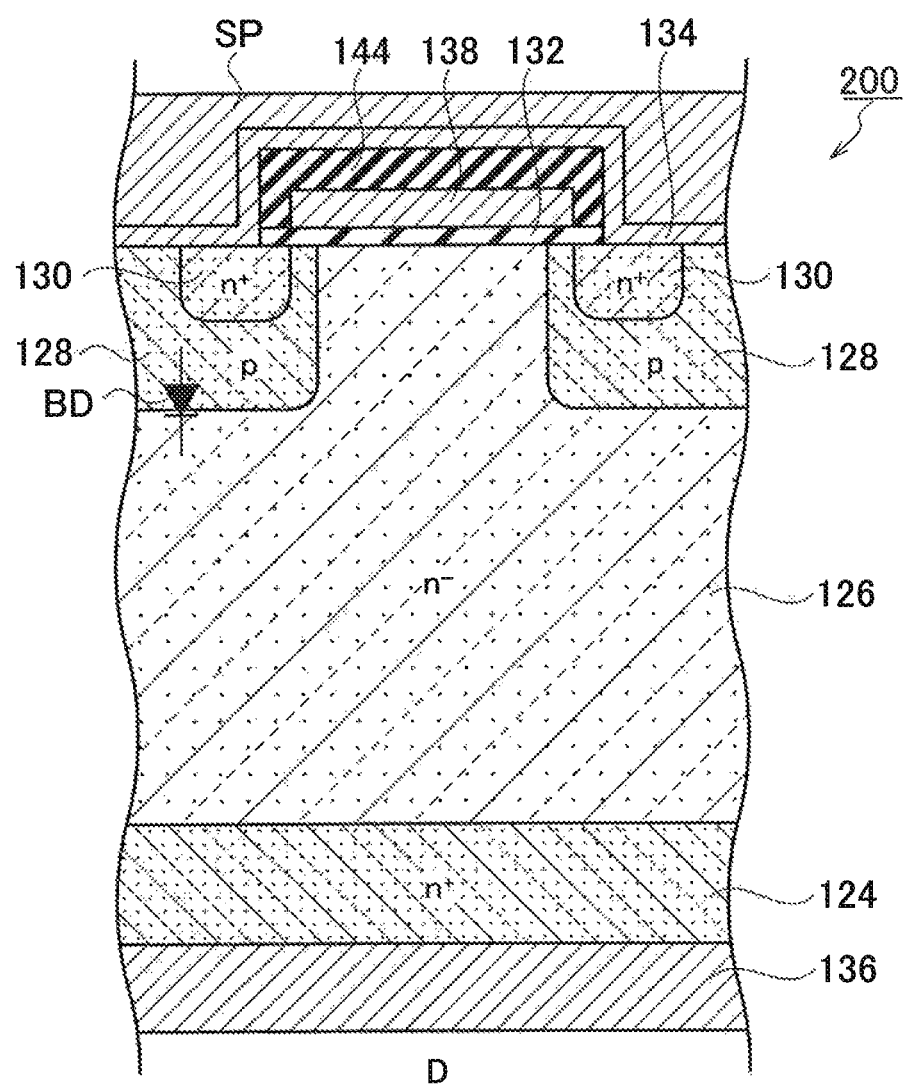
FIG. 21 is a schematic cross-sectional structure diagram of an SiC-DIMOSFET, which is an example of a semiconductor device applicable to the power circuit including the power module according to the embodiment.

FIG. 21 shows a schematic cross-sectional structure of SiC-Double Implanted MOSFET (SiC-DIMOSFET), in an example of a semiconductor device 200 applicable to the power circuit 2 including the power module 1 according to the embodiment.

As shown in FIG. 21, the SiC-DIMOSFET applicable to the power circuit 2 including the power module 1 according to the embodiment includes: an $n^+$ SiC substrate 124; an $n^-$ drift layer 126 epitaxially grown on the $n^+$ SiC substrate 124; a p body region 128 formed at a front surface side of the $n^-$ drift layer 126; an $n^+$ source region 130 formed on a front side surface of the p body region 128; a gate insulating layer 132 disposed on a front side surface of the $n^-$ drift layer 126 between the p body regions 128; a gate electrode 138 disposed on the gate insulating layer 132; a source electrode 134 electrically connected to the $n^+$ source region 130 and the p body region 128; and a drain electrode 136 electrically connected to a front side surface of the $n^+$ SiC substrate 124 which is opposite side of the $n^-$ drift layer 126. Moreover, a body diode BD is formed between the p body region 128 and the $n^-$ drift layer 126.

In the semiconductor device 200 shown in FIG. 21, the p body region 128 and the $n^+$ source region 130 formed on the front side surface of the p body region 128 are formed with double ion implantation (DI), and the source pad electrode SP is connected to the $n^+$ source region 130 and the source electrode 134 connected to the p body region 128. A gate pad electrode GP (not shown) is connected to the gate electrode 138 disposed on the gate insulating layer 132. Moreover, as shown in FIG. 21, the source pad electrode SP, the source electrode 134, and the gate pad electrode GP (not shown) are disposed on an interlayer insulating film 144 for passivation configured to cover the front side surface of the semiconductor device 200.
—SiC-TMOSFET—

Figure 22:
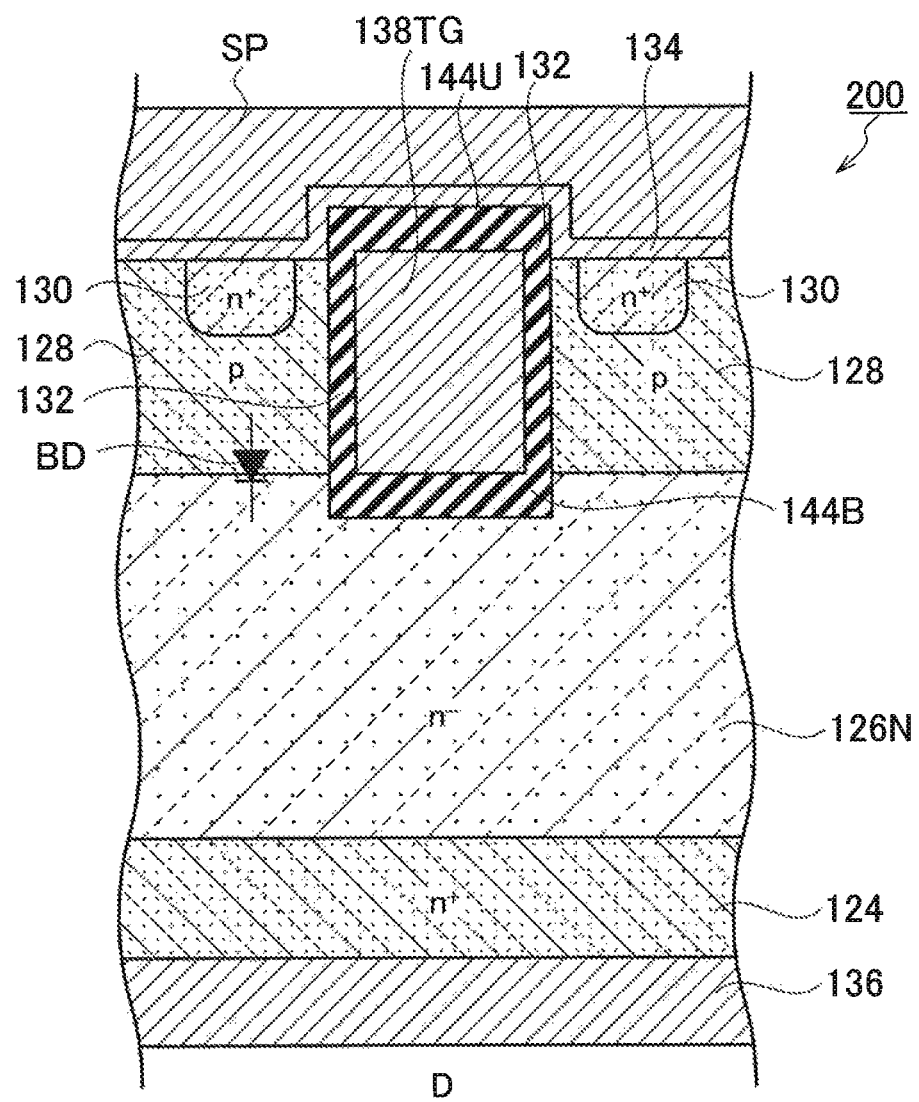
FIG. 22 is a schematic cross-sectional structure diagram of an SiC-TMOSFET, which is an example of the semiconductor device applicable to the power circuit including the power module according to the embodiment.

FIG. 22 shows a schematic cross-sectional structure of SiC-Trench MOSFET (SiC-TMOSFET), in an example of a semiconductor device 200 applicable to the power circuit 2 including the power module 1 according to the embodiment.

As shown in FIG. 22, the SiC-TMOSFET applicable to the power circuit 2 including the power module 1 according to the embodiment includes: an $n^+$ SiC substrate 124; an $n^-$ drift layer 126N epitaxially grown on the $n^+$ SiC substrate 124; a p body region 128 formed on a front surface side of the $n^-$ drift layer 126N; an $n^+$ source region 130 formed on a front side surface of the p body region 128; a trench gate electrode 138TG passing through the p body region 128, the trench gate electrode 138TG formed in the trench formed up to the $n^-$ drift layer 126N via the gate insulating layer 132 and the interlayer insulating films 144U and 144B; a source electrode 134 connected to the source region 130 and the p body region 128; and a drain electrode 136 electrically connected to a front side surface of the $n^+$ SiC substrate 124 which is opposite side of the $n^-$ drift layer 126N. Moreover, a body diode BD is formed between the p body region 128 and the $n^-$ drift layer 126N.

In the semiconductor device 200 shown in FIG. 22, the trench gate electrode 138TG passes through the p body region 128, and the trench gate electrode 138TG formed in the trench formed up to the $n^-$ drift layer 126N is formed via the gate insulating layer 132 and the interlayer insulating films 144U, 144B, and the source pad electrode SP is connected to the source region 130 and the source electrode 134 connected to the p body region 128. A gate pad electrode GP (not shown) is connected to the gate electrode 138 disposed on the gate insulating layer 132. Moreover, as shown in FIG. 22, the source pad electrode SP, the source electrode 134, and the gate pad electrode GP (not shown) are disposed on an interlayer insulating film 144U for passivation configured to cover the front side surface of the semiconductor device 200.

Since a junction resistor decompressed from the p body region 128 does not exist in the drain current path in the SiC-TMOSFET, it is possible to provide FET having lower on resistance as compared with the SIC-DMOSFET. Accordingly, it is also possible to allow drain pulse currents equal to or greater than 100 A per element.

Moreover, GaN based FETs etc. instead of the SiC based MOSFETs can also be adopted to the semiconductor device 200 which can be applied to the power module and the power circuit according to the embodiment.

Since the SiC device has high dielectric breakdown electric fields (for example, being approximately 3 MV/cm, and approximately 3 times of Si), it can secure a breakdown voltage even if a layer thickness of the drift layer is formed thinner and a carrier density thereof is set higher than those of the Si. Due to a difference between the dielectric breakdown electric fields, the peak electric field intensity of the SiC-MOSFET can be set up higher than the peak electric field intensity of the Si-MOSFET.

Since the film thickness of necessary n⁻ drift layers 126 and 126N is relatively thin and the carrier density thereof is relatively high in the SiC-MOSFET, the resistance value of the n⁻ drift layers 126 and 126N can be reduced, and the on resistance can be reduced. Accordingly, the chip area can be reduced (i.e., the chip size can be reduced). Since the breakdown voltage which may equal to that of the Si-IGBT can be realized as in the MOSFET structure which is a unipolar device, high breakdown voltages and high speed switching can be realized, and thereby reduction of switching power loss can be expected.

As mentioned above, according to the embodiment, there can be provided the power module and the power circuit which can simultaneously realize the low parasitic inductance and the low noise.

[Other Embodiments]

As explained above, the embodiments and the modified example thereof have been described, as a disclosure including associated description and drawings to be construed as illustrative, not restrictive. This disclosure makes clear a variety of alternative embodiments, working examples, and operational techniques for those skilled in the art.

Such being the case, the embodiments described herein cover a variety of the embodiments, whether described or not.

INDUSTRIAL APPLICABILITY

The power module and the power circuit according to the embodiments are applicable to booster circuits for HEV/EV, and three phase inverter circuits, etc. In particular, the power module and the power circuit according to the embodiments are applicable to wide applicable fields, e.g. DC/DC converters having advantages obtained by high-frequency operations.

What is claimed is:

1. A power module comprising:
   a bridge unit comprising a bridge circuit composed including a plurality of transistor elements and an internal capacitor connected so as to extend over between both ends of the bridge circuit;
   a positive-side power terminal and a negative-side power terminal of which one ends are respectively connected to both ends of the bridge unit and other ends are respectively exposed to an outside from a sealing unit for sealing the bridge unit; and
   a snubber circuit connected so as to extend over between an exposed side of the positive-side power terminal and an exposed side of the negative-side power terminal,
   wherein each of the positive-side power terminal and the negative-side power terminal is a flat metallic plate,
   the power module further comprises:
      a first metallic plate extending from the snubber circuit and connected to the positive-side power terminal, and
      a second metallic plate extending from the snubber circuit and connected to the negative side power terminal,
   the snubber circuit comprises a snubber circuit substrate, a snubber resistor, and a snubber capacitor,
   a value of the snubber resistor is a resistance value by which peak values of currents conducted to the positive side power terminal and the negative side power terminal can be substantially minimized, and
   the snubber circuit is disposed outside a connection region between the first metallic plate and the positive-side power terminal, and outside a connection region between the second metallic plate and the negative-side power terminal.

2. The power module according to claim 1, wherein the internal capacitor includes a plurality of capacitors connected in series to each other.

3. The power module according to claim 1, wherein at least one portion of the sealing unit is sealed with a resin layer by transfer molding.

4. The power module according to claim 1, wherein the snubber capacitor and the snubber resistor are connected in series to each other via a plurality of electrode patterns mounted on the snubber circuit substrate.

5. The power module according to claim 4, further comprising a parallel capacitor connected in parallel to the snubber resistor.

6. The power module according to claim 4, wherein a value of the snubber capacitor is more than 10 times of a value of the internal capacitor.

7. The power module according to claim 1, wherein the snubber circuit is sealed with a resin, and terminals exposed from the resin are respectively directly connected to the positive-side power terminal and the negative-side power terminal.

8. The power module according to claim 1, wherein the transistor element comprises one selected from the group consisting of an SiC-MOSFET and a wide gap transistor.

9. The power module according to claim 1, wherein each time constant of a current ringing vibration of a current conducted to the positive-side power terminal and the negative-side power terminal is equal to or less than 5 µs.

10. The power module according to claim 1, wherein the snubber circuit is inserted in parallel to the bridge unit.

11. A power module comprising:
    a main substrate;
    a first electrode pattern disposed on the main substrate, the first electrode pattern connected to a positive-side power terminal;
    a second electrode pattern disposed on the main substrate, the second electrode pattern connected to a negative-side power terminal;
    a third electrode pattern disposed on the main substrate, the third electrode pattern connected to an output terminal;
    a first transistor element of which a first output is disposed on the first electrode pattern;
    a second transistor element of which a second output is disposed on the third electrode pattern;
    an internal capacitor disposed between the first electrode pattern and the second electrode pattern; and
    a snubber circuit connected so as to extend over between a side of the positive-side power terminal exposed from a sealing unit and a side of the negative-side power terminal exposed from the sealing unit, the sealing unit configured to seal the first transistor element and the second transistor element,
    wherein each of the positive-side power terminal and the negative-side power terminal is a flat metallic plate,
    the power module further comprises:
      a first metallic plate extending from the snubber circuit and connected to the positive-side power terminal, and
      a second metallic plate extending from the snubber circuit and connected to the negative side power terminal, the snubber circuit comprises a snubber circuit substrate, a snubber resistor, and a snubber capacitor, a value of the snubber resistor is a resistance value by which peak values of currents conducted to the positive side power terminal and the negative side power terminal can be substantially minimized, and the snubber circuit is disposed outside a connection region between the first metallic plate and the positive-side power terminal, and outside a connection region between the second metallic plate and the negative-side power terminal.

12. The power module according to claim 11, wherein the main substrate comprises a ceramic substrate.

13. The power module according to claim 12, wherein the main substrate comprising the ceramic substrate has a multilayered structure.

14. A power module comprising:
a bridge unit comprising a bridge circuit composed including a plurality of transistor elements and an internal capacitor connected so as to extend over between both ends of the bridge circuit;
a positive-side power terminal and a negative-side power terminal of which one ends are respectively connected to both ends of the bridge unit and other ends are respectively exposed to an outside from a sealing unit for sealing the bridge unit; and
a snubber circuit connected so as to extend over between an exposed side of the positive-side power terminal and an exposed side of the negative-side power terminal, the snubber circuit configured to reduce a current noise of the positive-side power terminal and the negative-side power terminal,
wherein each of the positive-side power terminal and the negative-side power terminal is a flat metallic plate,
the power module further comprises:
a first metallic plate extending from a snubber circuit and connected to the positive-side power terminal, and
a second metallic plate extending from the snubber circuit and connected to the negative side power terminal,
the snubber circuit comprises a snubber circuit substrate, a snubber resistor, and a snubber capacitor,
a value of the snubber resistor is a resistance value by which peak values of currents conducted to the positive side power terminal and the negative side power terminal can be substantially minimized, and
the snubber circuit is disposed outside a connection region between the first metallic plate and the positive-side power terminal, and outside a connection region between the second metallic plate and the negative-side power terminal.

15. The power module according to claim 14, wherein an output terminal of the bridge circuit is exposed in a direction opposite to an exposed direction of the positive-side power terminal and the negative-side power terminal.

16. The power module according to claim 14, wherein each time constant of a current ringing vibration of a current conducted to the positive-side power terminal and the negative-side power terminal is equal to or less than 5.0 μs.

17. The power module according to claim 14, wherein the snubber circuit is inserted in parallel to the bridge unit.

18. A power circuit comprising:
a power module comprising:
a bridge unit comprising a bridge circuit composed including a plurality of transistor elements and an internal capacitor connected so as to extend over between both ends of the bridge circuit;
a positive-side power terminal and a negative-side power terminal of which one ends are respectively connected to both ends of the bridge unit and other ends are respectively exposed to an outside from a sealing unit for sealing the bridge unit; and
a snubber circuit connected so as to extend over between an exposed side of the positive-side power terminal and an exposed side of the negative-side power terminal; and a smoothing capacitor connected in parallel to the snubber circuit,
wherein each of the positive-side power terminal and the negative-side power terminal is a flat metallic plate,
the power module further comprises:
a first metallic plate extending from the snubber circuit and connected to the positive-side power terminal, and
a second metallic plate extending from the snubber circuit and connected to the negative side power terminal,
the snubber circuit comprising a snubber circuit substrate, a snubber resistor, and a snubber capacitor,
a value of the snubber resistor is a resistance value by which peak values of currents conducted to the positive side power terminal and the negative side power terminal can be substantially minimized, and
the snubber circuit is disposed outside a connection region between the first metallic plate and the positive-side power terminal, and outside a connection region between the second metallic plate and the negative-side power terminal.

19. The power module according to claim 18, wherein the snubber circuit is inserted in parallel to the bridge unit.

20. The power module according to claim 18, wherein the resistance value of the snubber resistor is approximately a value of a characteristic impedance $(Z_o=(L_{pp}/C_{pp})^{1/2})$ expressed with a parasitic capacitance $C_{pp}$ and a parasitic inductance $L_{pp}$ in a closed loop of the snubber circuit and the smoothing capacitor.

21. A power circuit comprising:
a power module comprising:
a main substrate;
a first electrode pattern disposed on the main substrate, the first electrode pattern connected to a positive-side power terminal;
a second electrode pattern disposed on the main substrate, the second electrode pattern connected to a negative-side power terminal;
a third electrode pattern disposed on the main substrate, the third electrode pattern connected to an output terminal;
a first transistor element of which a first output is disposed on the first electrode pattern; a second transistor element of which a second output is disposed on the third electrode pattern; an internal capacitor disposed between the first electrode pattern and the second electrode pattern; and
a snubber circuit connected so as to extend over between a side of the positive-side power terminal exposed from a sealing unit and a side of the negative-side power terminal exposed from the sealing unit, the sealing unit configured to seal the first transistor element and the second transistor element; and a smoothing capacitor connected in parallel to the snubber circuit, wherein each of the positive-side power terminal and the negative-side power terminal is a flat metallic plate, the power module further comprises:
- a first metallic plate extending from the snubber circuit and connected to the positive-side power terminal, and
- a second metallic plate extending from the snubber circuit and connected to the negative side power terminal, the snubber circuit comprises a snubber circuit substrate, a snubber resistor, and a snubber capacitor, a value of the snubber resistor is a resistance value by which peak values of currents conducted to the positive side power terminal and the negative side power terminal can be substantially minimized, and the snubber circuit is disposed outside a connection region between the first metallic plate and the positive-side power terminal, and outside a connection region between the second metallic plate and the negative-side power terminal.

22. The power circuit according to claim 21, wherein the main substrate comprises a ceramic substrate.

23. The power circuit according to claim 22, wherein the main substrate comprising the ceramic substrate has a multilayered structure.

24. The power circuit according to claim 21, wherein the internal capacitor comprises a plurality of capacitors connected in series to each other.

25. The power circuit according to claim 21, wherein at least one portion of the sealing unit is sealed with a resin layer by transfer molding.

26. The power circuit according to claim 21, wherein the snubber capacitor and the snubber resistor are connected in series to each other via a plurality of electrode patterns mounted on the snubber circuit substrate.

27. The power circuit according to claim 26, further comprising: a parallel capacitor connected in parallel to the snubber resistor.

28. The power module according to claim 21, wherein the resistance value of the snubber resistor is a approximately value of a characteristic impedance $(Z_o=(L_{pp}/C_{pp})^{1/2})$ expressed with a parasitic capacitance $C_{pp}$ and a parasitic inductance $L_{pp}$ in a closed loop of the snubber circuit and the smoothing capacitor.

* * * * *